(12) United States Patent
Sogard

(10) Patent No.: US 7,548,303 B2
(45) Date of Patent: Jun. 16, 2009

(54) COOLING ASSEMBLY FOR A STAGE

(75) Inventor: Michael Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 323 days.

(21) Appl. No.: 10/933,563

(22) Filed: Sep. 4, 2004

(65) Prior Publication Data

US 2006/0048363 A1    Mar. 9, 2006

(51) Int. Cl.
*G03B 27/58* (2006.01)
*G03B 27/62* (2006.01)

(52) U.S. Cl. .......................... 355/72; 355/75
(58) Field of Classification Search ............ 355/72, 355/77, 53, 30, 55, 75; 250/442.11; 318/649
See application file for complete search history.

(56) References Cited

U.S. PATENT DOCUMENTS

| | | |
|---|---|---|
| 3,719,842 A | 3/1973 | Kuntz |
| 3,780,325 A | 12/1973 | Frankenhauser |
| 3,849,680 A | 11/1974 | Heller |
| 4,047,061 A | 9/1977 | Kilmer et al. |
| 4,115,712 A | 9/1978 | Guimbal |
| 4,172,229 A | 10/1979 | Guimbal |
| 4,424,505 A | 1/1984 | Yatsushiro et al. |
| 4,427,907 A | 1/1984 | Flick et al. |
| 4,535,278 A | 8/1985 | Asakawa |
| 4,625,132 A | 11/1986 | Chitayat |
| 4,654,571 A | 3/1987 | Hinds |
| 4,698,756 A | 10/1987 | Gonzalez et al. |
| 4,749,921 A | 6/1988 | Chitayat |
| 4,839,545 A | 6/1989 | Chitayat |
| 4,906,878 A | 3/1990 | Twaalfhoven et al. |
| 4,916,340 A | 4/1990 | Negishi |
| 5,036,245 A | 7/1991 | Ohnishi et al. |
| 5,073,734 A | 12/1991 | Combette |
| 5,138,206 A | 8/1992 | Schmidt |
| 5,528,118 A | 6/1996 | Lee |
| 5,572,077 A | 11/1996 | Kimura |
| 5,623,853 A | 4/1997 | Novak et al. |

(Continued)

FOREIGN PATENT DOCUMENTS

EP    1491960 A2    12/2004

OTHER PUBLICATIONS

U.S. Appl. No. 09/715,266, filed Nov. 20, 2000, Hazelton et al.

(Continued)

*Primary Examiner*—Peter B Kim
(74) *Attorney, Agent, or Firm*—Roeder & Broder LLP

(57) ABSTRACT

A stage assembly (218) for positioning a work piece (30) includes a stage (238), a heat transfer region (246), a stage mover assembly (240), and an environmental system (226). The stage (238) retains the work piece (30). The heat transfer region (246) is positioned near the stage (238). The stage mover assembly (240) moves the stage (238) relative to the heat transfer region (246). The environmental system (226) directly controls the temperature of the heat transfer region (246). For example, the environmental system (226) can circulate a circulation fluid near the heat transfer region (246). A bearing (254B) can maintain the stage (238) spaced apart from the heat transfer region (246).

34 Claims, 13 Drawing Sheets

U.S. PATENT DOCUMENTS

| | | | |
|---|---|---|---|
| 5,703,418 A | 12/1997 | Assa | |
| 5,703,420 A | 12/1997 | Kamata et al. | |
| 5,751,077 A | 5/1998 | Gonzalez | |
| 5,780,943 A | 7/1998 | Ono | |
| 5,783,877 A | 7/1998 | Chitayat | |
| 5,828,142 A | 10/1998 | Simpson | |
| 5,834,862 A | 11/1998 | Hartzell, Jr. | |
| 5,886,432 A | 3/1999 | Markle | |
| 6,084,319 A | 7/2000 | Kamata et al. | |
| 6,114,781 A | 9/2000 | Hazelton et al. | |
| 6,184,596 B1 | 2/2001 | Ohzeki | |
| 6,215,642 B1 | 4/2001 | Sogard | |
| 6,288,460 B1 | 9/2001 | Fakult et al. | |
| 6,313,550 B1 | 11/2001 | Binnard et al. | |
| 6,313,556 B1 | 11/2001 | Dombrovski et al. | |
| 6,339,266 B1 | 1/2002 | Tanaka | |
| 6,555,936 B1 | 4/2003 | Tanaka et al. | |
| 6,628,503 B2 | 9/2003 | Sogard | |
| 6,756,706 B2 | 6/2004 | Watson | |
| 2001/0023927 A1* | 9/2001 | Hazelton | 250/442.11 |
| 2004/0130688 A1* | 7/2004 | Emoto | 355/30 |
| 2005/0001579 A1* | 1/2005 | Touzov | 318/649 |
| 2005/0134827 A1* | 6/2005 | Box et al. | 355/72 |

OTHER PUBLICATIONS

U.S. Appl. No. 10/734,396, filed Dec. 12, 2003, Alton H. Phillips.
U.S. Appl. No. 10/777,515, filed Feb. 11, 2004, Alton H. Phillips.
D.R. Wright et al. "Low temperature etch chuck: Modeling and experimental results of heat transfer and water temperature." J. Vac. Sci. Technol. A 10(4), Jul./Aug. 1992. Copyright 1992 American Vacuum Society. pp. 1065-1070.

* cited by examiner

| MODEL INPUTS | Argon | Helium | Nitrogen |
|---|---|---|---|
| Universal Gas Constant (J/mol K) | 8.3145 | 8.3145 | 8.3145 |
| Average Temperature (K) | 283 | 283 | 283 |
| Temperature Difference | 10 | 10 | 10 |
| Pressure (Pa) | 130 | 130 | 130 |
| bearing pressure (Pa) | 4.00E+05 | 4.00E+05 | 4.00E+05 |
| Relief gap (m) | 1.00E-03 | 1.00E-03 | 1.00E-03 |
| *gas bearing gap (m)* | *6.00E-06* | *6.00E-06* | *6.00E-06* |
| Molecular weight | 39.948 | 4.00 | 28 |
| viscosity (kg/ms) | 2.20E-05 | 1.95E-05 | 1.80E-05 |
| Thermal Conductivity W/mK | 0.01752 | 0.155 | 0.0258 |
| specific heat (constant volume) J/kgK | 312 | 3120 | 744 |
| ratio of specific heat | 1.67 | 1.67 | 1.4 |
| Accomodation Coefficient | 0.5 | 0.5 | 0.5 |
| Area | 0.4 | 0.4 | 0.4 |
| *Fraction of area represented by gas bearing* | 0.25 | 0.25 | 0.25 |
| Stefan Boltzman Constant | 5.67E-08 | 5.67E-08 | 5.67E-08 |
| Emissivity | 0.5 | 0.5 | 0.5 |
| MODEL OUTPUTS | | | |
| mean free path (m) | 5.15E-05 | 1.44E-04 | 5.03E-05 |
| Knudsen number | 5.148E-02 | 1.442E-01 | 5.031E-02 |
| *Knudsen number – bearing* | *2.788E-03* | *7.808E-03* | *2.725E-03* |
| Regime | transition | transition | transition |
| *Regime – bearing* | *Continuum* | *Continuum* | *Continuum* |
| CONTINUUM – heat transfer – Kn<0.01 watts | | | |
| Relief | 52.6 | 465.0 | 77.4 |
| *Bearing* | *2920.0* | *25833.3* | *4300.0* |
| FREE MOLECULAR – heat transfer – Kn>10 watts | | | |
| Relief | 89.0 | 281.7 | 159.8 |
| *Bearing* | *91289.5* | *288945.1* | *163884.3* |
| TRANSITION – heat transfer – 0.01<Kn<10 watts | | | |
| Relief | 99.1 | 526.3 | 156.4 |
| *Bearing* | *2829.5* | *23713.2* | *4190.1* |
| RADIATIVE – heat transfer watts | 10.3 | 10.3 | 10.3 |
| Total Heat Transfer (W) | 3029.4 | 26369.9 | 4466.7 |
| Total Heat Transfer (W/m2) | 7573.6 | 65924.8 | 11166.8 |
| Heat transfer at bearing surface (W/m2) | 29200.0 | 258333.3 | 43000.0 |

Fig. 2E

COOLING ASSEMBLY FOR A STAGE

BACKGROUND

Lithography exposure apparatuses are commonly used to transfer images from a reticle onto a semiconductor wafer during semiconductor processing. A typical exposure apparatus includes an illumination source, a reticle stage assembly that positions a reticle, an optical assembly, a wafer stage assembly that positions a semiconductor wafer, and a measurement system that precisely monitors the position of the reticle and the wafer.

The illumination source generates a beam of light energy that is directed at the reticle. The projection optical assembly directs and/or focuses the light from the reticle to the wafer. The reticle stage assembly includes a reticle stage and one or more motors to precisely position the reticle relative to the projection optical assembly. Similarly, the wafer stage assembly includes a wafer stage and one or more motors that precisely position the wafer relative to the projection optical assembly.

Depending upon the wavelength of the light energy generated by the illumination source, the type of fluid between the illumination source and the wafer can greatly influence the performance of the exposure apparatus. For example, some types of light energy are absorbed by oxygen and other gases. Absorption of the light energy can lead to losses of intensity and uniformity of the light energy. Accordingly, the performance of the exposure apparatus and the quality of the integrated circuits formed on the wafer can be enhanced by controlling the environment around one or both stages.

One way to control the environment around a stage includes positioning a chamber around the stage. Subsequently, the desired environment can be created within the chamber around the stage. One type of controlled environment is a vacuum.

Unfortunately, stages generate heat from on-board actuators or sensors, as well as from absorption of the exposure radiation on the reticle or wafer. This heat must be removed in order for the stages to perform correctly. Traditional means include convection, conduction and radiation heat transfer to the surrounding air and surfaces for stages operating in air, in addition to heat transfer through coolants circulated through the stages and hoses to a fixed heat exchanger. However, in a vacuum, convection and conduction through air is absent; only radiant cooling remains, which is typically inadequate. Pumping coolant through hoses is much more difficult because the hoses must be vacuum compatible in addition to their other required properties. In either case, the hoses are displaced during stage motion, and this motion in turn perturbs the stage motion, making precision motion difficult.

SUMMARY

The present invention is directed to a stage assembly for positioning a device, the stage assembly includes a stage, a heat transfer region, a stage mover assembly, and an environmental system. The stage retains the device. In one embodiment, the heat transfer region is positioned near the stage. The stage mover assembly moves the stage relative to the heat transfer region. The environmental system controls the temperature of the heat transfer region. For example, the environmental system can circulate a circulating fluid near the heat transfer region. In one embodiment, the heat transfer region provides for the removal of heat from the stage mover assembly. Alternatively, the present invention could also be used to heat a stage mover assembly, by suitable adjustment of the temperature of the heat transfer region.

In one embodiment, the stage includes a fluid bearing that separates the stage from the heat transfer region so that heat from the stage is transferred via the bearing to the heat transfer region.

Additionally, in one embodiment, the stage assembly includes a guide beam that guides the movement of the stage. In one embodiment, the heat transfer region is part of the guide beam.

Moreover, in one embodiment, the stage assembly can include a shield assembly that shields the heat transfer region from the surrounding environment.

The present invention is also directed to an exposure apparatus, a wafer, a device, a method for making a stage assembly, a method for making an exposure apparatus, a method for making a device, and a method for manufacturing a wafer.

BRIEF DESCRIPTION OF THE DRAWINGS

FIG. 2E is a table that lists modeling and experimental results;

DESCRIPTION

Figure 1:
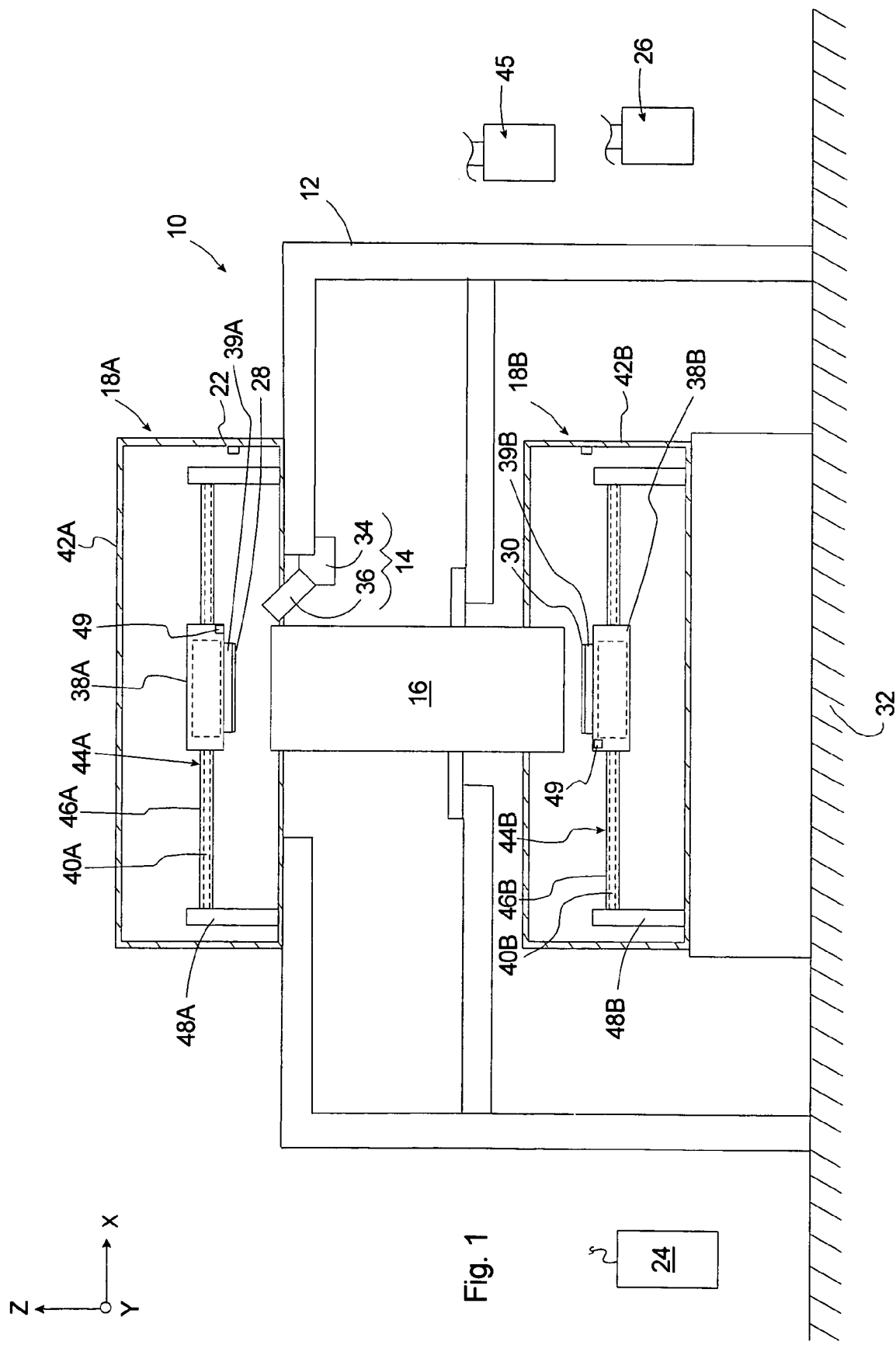
FIG. 1 is a side illustration of an exposure apparatus, in partial cut-away, having features of the present invention.

FIG. 1 is a schematic illustration of a precision assembly, namely an exposure apparatus 10 having features of the present invention. The exposure apparatus 10 includes an apparatus frame 12, an illumination system 14 (irradiation apparatus), an optical assembly 16, a first stage assembly 18A, a second stage assembly 18B, a measurement system 22, a control system 24, and a stage environmental system 26."

The design of the components of the exposure apparatus 10 can be varied to suit the design requirements of the exposure apparatus 10.

A number of Figures include an orientation system that illustrates an X axis, a Y axis that is orthogonal to the X axis, and a Z axis that is orthogonal to the X and Y axes. It should be noted that these axes can also be referred to as the first, second and third axes.

In one embodiment, the exposure apparatus 10 is useful as a lithographic device that transfers a pattern (not shown) of an integrated circuit from a reticle 28 onto a semiconductor wafer 30. The reticle 28 and/or the wafer 30 are also referred to generally as a device and/or a work piece. The exposure apparatus 10 mounts to a mounting base 32, e.g., the ground, a base, or floor or some other supporting structure.

There are a number of different types of lithographic devices. In one embodiment, the exposure apparatus 10 is a scanning type photolithography system that exposes the pattern from the reticle 28 onto the wafer 30 with the reticle 28 and the wafer 30 moving synchronously. In a scanning type lithographic apparatus, the reticle 28 is moved perpendicularly to an optical axis of the optical assembly 16 by the reticle stage assembly 18A and the wafer 30 is moved perpendicularly to the optical axis of the optical assembly 16 by the wafer stage assembly 18B. Scanning of the reticle 28 and the wafer 30 occurs while the reticle 28 and the wafer 30 are moving synchronously.

Alternatively, the exposure apparatus 10 can be a step-and-repeat type photolithography system that exposes the reticle 28 while the reticle 28 and the wafer 30 are stationary. In the step and repeat process, the wafer 30 is in a constant position relative to the reticle 28 and the optical assembly 16 during the exposure of an individual field. Subsequently, between consecutive exposure steps, the wafer 30 is consecutively moved with the wafer stage assembly 18B perpendicularly to the optical axis of the optical assembly 16 so that the next field of the wafer 30 is brought into position relative to the optical assembly 16 and the reticle 28 for exposure. Following this process, the images on the reticle 28 are sequentially exposed onto the fields of the wafer 30, and then the next field of the wafer 30 is brought into position relative to the optical assembly 16 and the reticle 28.

However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head. In addition to a photolithography system, the exposure apparatus 10 may be a charged particle lithography system such as an electron beam or ion beam lithography system.

The apparatus frame 12 supports some of the components of the exposure apparatus 10. The apparatus frame 12 illustrated in FIG. 1 supports the reticle stage assembly 18A, the optical assembly 16 and the illumination system 14 above the mounting base 32.

The illumination system 14 includes an illumination source 34 and an illumination optical assembly 36. The illumination source 34 emits a beam (irradiation) of light energy. The illumination optical assembly 36 guides the beam of light energy from the illumination source 34 to the reticle 28. The beam illuminates selectively different portions of the reticle 28 and exposes the wafer 30. In FIG. 1, the illumination system 14 is illustrated as being supported below the reticle stage assembly 18. In this embodiment, the energy beam from the illumination system 14 is directed upwards towards the reticle 28 and reflected off the reticle 28 downward to the optical assembly 16. Alternatively, for example, the illumination system 14 can be positioned elsewhere.

The illumination source 34 can be a g-line source (436 nm), an i-line source (365 nm), a KrF excimer laser (248 nm), an ArF excimer laser (193 nm) or a $F_2$ laser (157 nm). Alternatively, the illumination source 34 can generate charged particle beams such as an electron beam. Furthermore, in the case where an electron beam is used, the structure could be such that either a mask is used or a pattern can be directly formed on a substrate without the use of a mask.

The optical assembly 16 projects and/or focuses the light from the reticle 28 to the wafer 30. Depending upon the design of the exposure apparatus 10, the optical assembly 16 can magnify or reduce the image illuminated on the reticle 28.

When deep ultra-violet radiation such as produced by an excimer laser is used, glass materials such as quartz and fluorite that transmit far ultra-violet rays can be used in the optical assembly 16. When an electron beam is used, electron optics can consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668, 672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

The first stage assembly 18A holds and positions the reticle 28 relative to the optical assembly 16 and the wafer 30. In one embodiment, the first stage assembly 18A includes (i) a first stage 38A having a first chuck 39A that retains the reticle 28, (ii) a first stage mover assembly 40A (illustrated in phantom) that moves and positions the reticle stage 38A and reticle 28, (iii) a first chamber assembly 42A that encircles and encloses the first stage 38A, and the reticle 28, (iv) a first guide beam 44A that includes a first heat transfer region 46A, and (v) a pair of spaced apart first beam supports 48A that secure the first guide beam 44A to the apparatus frame 12.

The second stage assembly 18B holds and positions the wafer 30 with respect to the projected image of the illuminated portions of the reticle 28. In one embodiment, the second stage assembly 18B includes (i) a second stage 38B having a second chuck 39B that retains the wafer 30, (ii) a second stage mover assembly 40B (illustrated in phantom) that moves and positions the second stage 38B and wafer 30, (iii) a second chamber assembly 42B that encircles and encloses the second stage 38B, and the wafer 30, (iv) a second guide beam 44B that includes a second heat transfer region 46B, and (v) a pair of spaced apart second beam supports 48B that secure the second guide beam 44B to the apparatus frame 12.

Each chuck 39A, 39B can be a vacuum chuck, an electrostatic chuck, or some other type of chuck. Additionally, for example, one or both of the stage mover assemblies 18A, 18B can include a chuck mover assembly (not shown) that moves and adjusts the position of the respective chuck 39A, 39B relative to the respective stage 38A, 38B. For example, the chuck mover assembly can adjust the position of the respective chuck 39A, 39B with one to six degrees of freedom.

The chamber assemblies 42A, 42B facilitate the creation of a controlled environment around the respective device. Each chamber assembly 42A, 42B can be sized and shaped according to the design of the other components of the exposure apparatus 10. In FIG. 1, each chamber assembly 42A, 42B is generally rectangular box shaped. In one embodiment, each chamber assembly 42A, 42B is rigid and is constructed from materials such as metal or plastic. The required thickness and strength of each chamber assembly 42A, 42B will depend upon type of controlled environment. For example, thicker and stronger walls and hermetic seals are necessary if the controlled environment is a vacuum.

Alternatively, for example, one or both of the stage assemblies 18A, 18B can be designed without the respective chamber assembly 42A, 42B.

Additionally, the exposure apparatus 10 can include a chamber environmental system 45 that is in fluid communication with and controls the environment in one or both of the chamber assemblies 42A, 42B. The desired environment created and/or controlled in the chamber assemblies 42A, 42B by the chamber environmental system 45 can be selected according to the design of the rest of the components of the exposure apparatus 10, including the illumination system 14. For example, the desired controlled environment can be a vacuum type environment. In this embodiment, the chamber environmental system 45 removes the fluid from the chamber assemblies 42A, 42B. Alternatively, for example, the controlled environment can be an inert gas, such as Argon, Helium, or Nitrogen, or another type of fluid. In this embodiment, the chamber environmental system 45 fills the chamber assemblies 42A, 42B with the desired fluid.

The chamber environmental system 45 can include one or more pumps, reservoirs, and/or vacuum pumps. Additionally, the chamber environmental system 45 can include multiple separate systems.

In photolithography systems, when linear motors (see U.S. Pat. Nos. 5,623,853 or 5,528,118) are used in the wafer stage assembly or the reticle stage assembly, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

The measurement system 22 monitors movement of the reticle 28 and the wafer 30 relative to the optical assembly 16 or some other reference. With this information, the control system 24 can control the first stage assembly 18A to precisely position the reticle 28 and the second stage assembly 18B to precisely position the wafer 30. The design of the measurement system 22 can vary. For example, the measurement system 22 can utilize multiple laser interferometers, encoders, mirrors, and/or other measuring device.

The control system 24 is electrically connected to the measurement system 22, the stage assemblies 18A, 18B, and the environmental systems 26, 45. In one embodiment, the control system 24 receives information from the measurement system 22 and controls the stage mover assemblies 40A, 40B to precisely position the reticle 28 and the wafer 30. Additionally, the control system 24 can control the operation of the components of the environmental systems 26, 45. The control system 24 can include one or more systems, processors and circuits.

The stage environmental system 26 controls the temperature of at least a portion of one or both of the stage assemblies 18A, 18B. For example, the stage environmental system 26 can control the temperature of the stages 38A, 38B by directly controlling the temperature of the heat transfer regions 46A, 46B. In one embodiment, the stage environmental system 26 controls the temperature of a temperature sensitive region 49 (illustrated as a box) of the stages 38A, 38B. Non-exclusive examples of the temperature sensitive regions 49 can include (i) an area near each chuck 39A, 39B to inhibit thermal deformation of the reticle 28 or wafer 30, (ii) an area between each chuck 39A, 39B and an interferometer mirror (not shown) to inhibit a change of distance there between, (iii) one or more sensors or monitors that are part of the stage, and/or (iv) one or more actuators that are part of the stages.

Figure 2A:
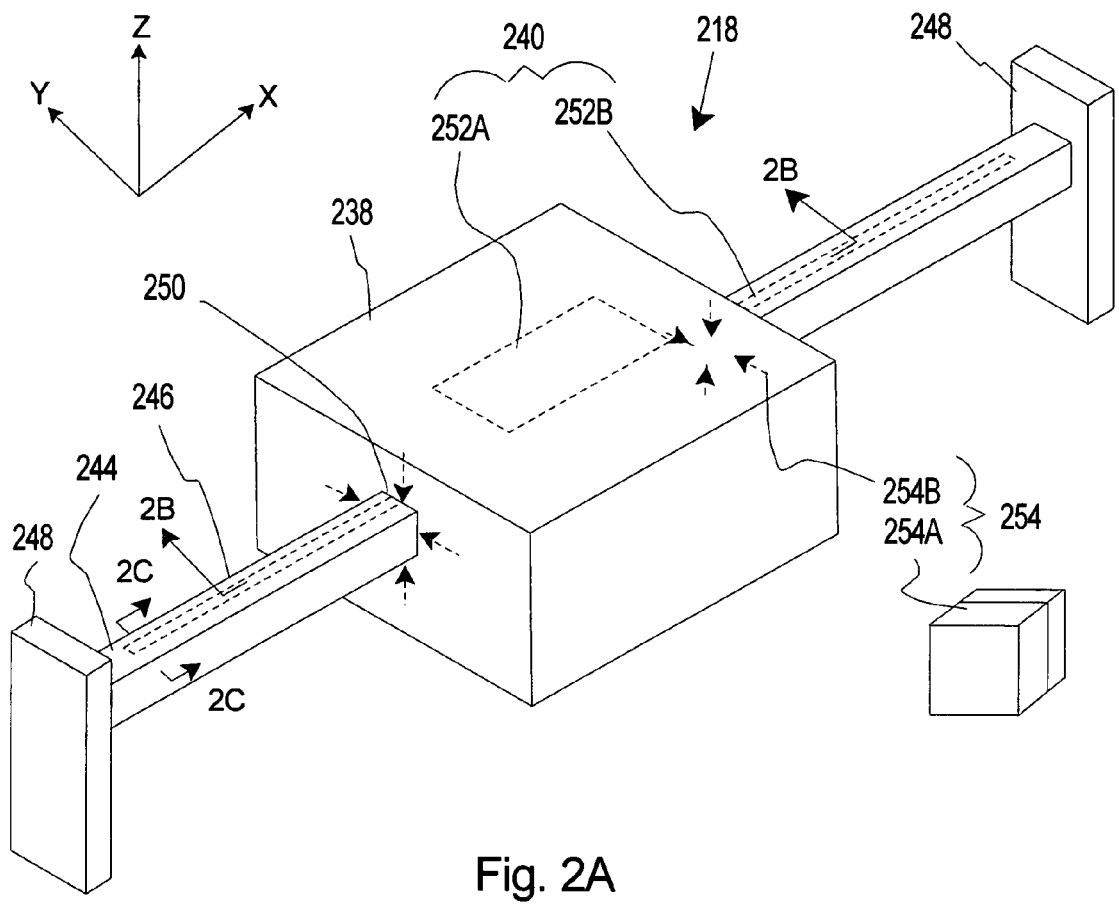
FIG. 2A is a perspective view of a stage assembly having features of the present invention.

FIG. 2A is a perspective view of a first embodiment of a stage assembly 218 having features of the present invention. The chuck and the work piece are not illustrated in FIG. 2A. The stage assembly 218 can be used as the first stage assembly 18A or the second stage assembly 18B described above and illustrated in FIG. 1. Alternatively, the stage assembly 218 can be used to move other types of devices during manufacturing and/or inspection, to move a device under an electron microscope (not shown), or to move a device during a precision measurement operation (not shown).

In FIG. 2A, the stage assembly 218 includes (i) the stage 238, (ii) the stage mover assembly 240 (illustrated in phantom) that moves and positions the stage 238, (iii) the guide beam 244 that includes the heat transfer region 246, and (iv) the spaced apart beam supports 248. In this embodiment, the stage 238 is generally rectangular block shaped and includes a rectangular shaped stage aperture 250 that extends transversely through the stage 238 so that the stage 238 can receive the guide beam 244.

The stage mover assembly 240 moves the stage 238 and the workpiece (illustrated in FIG. 1) relative to the apparatus frame 12 (illustrated in FIG. 1) and the mounting base 32 (illustrated in FIG. 1). In alternative embodiments, the stage mover assembly 240 can be designed to move the stage 238 with one, two, three, four, five or six degrees of freedom. The stage mover assembly 240 can include one or more movers, such as rotary motors, voice coil motors, linear motors utilizing a Lorentz force to generate drive force, electromagnetic movers, planar motor, or some other force movers.

In FIG. 2A, the stage mover assembly 240 moves the stage 238 with one degree of freedom, namely along the X axis. In this embodiment, the stage mover assembly 240 includes a magnet component 252A (illustrated in phantom) having one or more magnets and a conductor component 252B (illustrated in phantom) having one or more conductors. In this embodiment, one of the components 252A, 252B is secured to the guide beam 244 and the other component 252B, 252A is secured to the stage 238. With this design, the control system 24 (illustrated in FIG. 1) directs electrical current to the conductor component 252B to move and position the stage 238 relative to the guide beam 244.

In an alternative embodiment, for example, (i) one of the components 252B, 252A is secured to another beam (not shown) that extends parallel with the guide beam 244 and (ii) the other component 252A, 252B is secured to the stage 238.

With this design, reaction forces generated by the stage mover assembly 240 are not transferred to the guide beam 244.

In FIG. 2A, the guide beam 244 guides the motion of the stage 238 along the X axis and inhibits relative motion between the guide beam 244 and the stage 238 along the Y and Z axes, and about the X, Y, Z axes. Further, in this embodiment, the guide beam 244 is generally rectangular bar shaped. Moreover, in this embodiment, the heat transfer region 246 is disposed in the guide beam 244. More specifically, in this embodiment, the heat transfer region 246 is defined by the outer perimeter of the guide beam 244.

In FIG. 2A, a bearing assembly 254 (illustrated as arrows) maintains the stage 238 spaced apart a stage gap 256 (illustrated in FIG. 2B) along the Y and Z axes relative to the guide beam 244 and allows for motion of the stage 238 along the X axis. The design of the bearing assembly 254 can be changed to suit the environment created around the stage 238. In one embodiment, the bearing assembly 254 includes a bearing supply 254A that directs a fluid to the stage gap 256 via a conduit (not shown), to create a plurality of opposed fluid type bearings 254B (illustrated as arrows) that maintain the stage 238 spaced apart from the guide beam 244 in a non-contact manner. In this embodiment, each fluid type bearing 254B can be a vacuum compatible fluid type bearing.

Figure 2B:
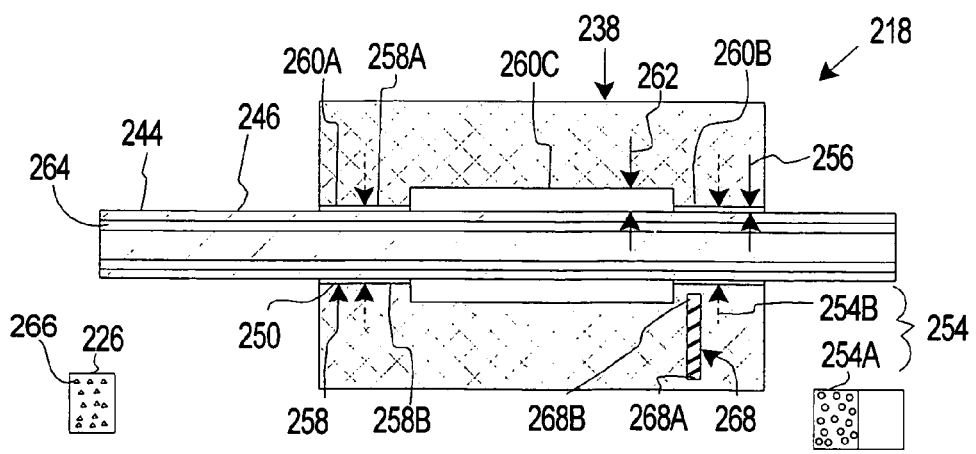
FIG. 2B is a cut-away view taken on line 2B-2B in FIG. 2A and a side illustration of a bearing supply and a stage environmental system.

FIG. 2B illustrates a cut-away view of the guide beam 244 and the stage 238 of the stage assembly 218 of FIG. 2A. FIG. 2B also illustrates the stage environmental system 226, and the bearing assembly 254.

Additionally, FIG. 2B illustrates that the stage 238 includes a plurality of slider regions 258 that cooperate to define the stage aperture 250. Further, the slider regions 258 are positioned around and adjacent to the guide beam 244. More specifically, in this embodiment, the stage 238 includes an upper slider region 258A, a lower slider region 258B that is opposite the upper slider region 258A, a front slider region (not shown), and a rear slider region (not shown) that is opposite the front slider region. The design of each slider region 258 can be changed to suit the design requirements of the stage 238. In FIG. 2B, each slider region 258 includes a first bearing pad 260A, a spaced apart second bearing pad 260B, and a relieved area 260C that separates the bearing pads 260A, 260B. Typically, a significant fraction of the inner surface of each slider region 258 is relieved. Each slider region 258 can be integrally formed into the rest of the stage 238 or formed from one or more separate components.

Moreover, FIG. 2B illustrates that the bearing assembly 254 creates the fluid bearing 254B between each bearing pad 260A, 260B and the guide beam 244. Further, FIG. 2B also illustrates that the stage gap 256 is maintained between each bearing pad 260A, 260B and the heat transfer region 246 of the guide beam 244. Moreover, a relief gap 262 separates the relieved area 260C of each slider region 258 from the heat transfer region 246. In alternative, non-exclusive embodiments, the stage gap 256 is between approximately 3 μm and 20 μm and the relief gap 262 is between approximately 50 μm and 5 mm.

In one embodiment, the pressure in the relief gap 262 is less than the pressure in the stage gap 256. This is particularly true for vacuum applications, where a high pressure in the relief gap 262 would tend to distort the slider region 258. As a result, in certain embodiments, much of the heat transfer occurs at the slider regions 258.

As briefly described above, in one embodiment, the heat transfer region 246 is cooled by the stage environmental system 226. The type of cooling can be varied. In one embodiment, the guide beam 244 includes a plurality of spaced apart circulation passageways 264 distributed around the perimeter of the guide beam 244. In this embodiment, the stage environmental system 226 is in fluid communication with the circulation passageways 264 and directs a circulation fluid 266 (illustrated as triangles) via a conduit (not shown), to the circulation passageways 264 to directly control the temperature of the heat transfer surface 246.

In this embodiment, the very small stage gap 256 at the bearings 254B acts as the thermal conductive path from the stage 238 to the heat transfer region 246. Stated another way, in this embodiment, heat from the stage 238 is conducted through the fluid in the bearings 254B to the heat transfer region 246. To facilitate this, in one embodiment, the temperature of heat transfer region 246 is maintained at a different value from the temperature of the surfaces of stage 238 facing heat transfer region 246. If the stage gap 256 is small enough the heat transfer can be substantial.

Moreover, in certain embodiments, heat from the stage 238 is also conducted via the relief gap 262. The amount of heat transferred via the relief gap 262 will depend on the size of the relief gap 262 and the size of the relieved area 260.

Figure 7:
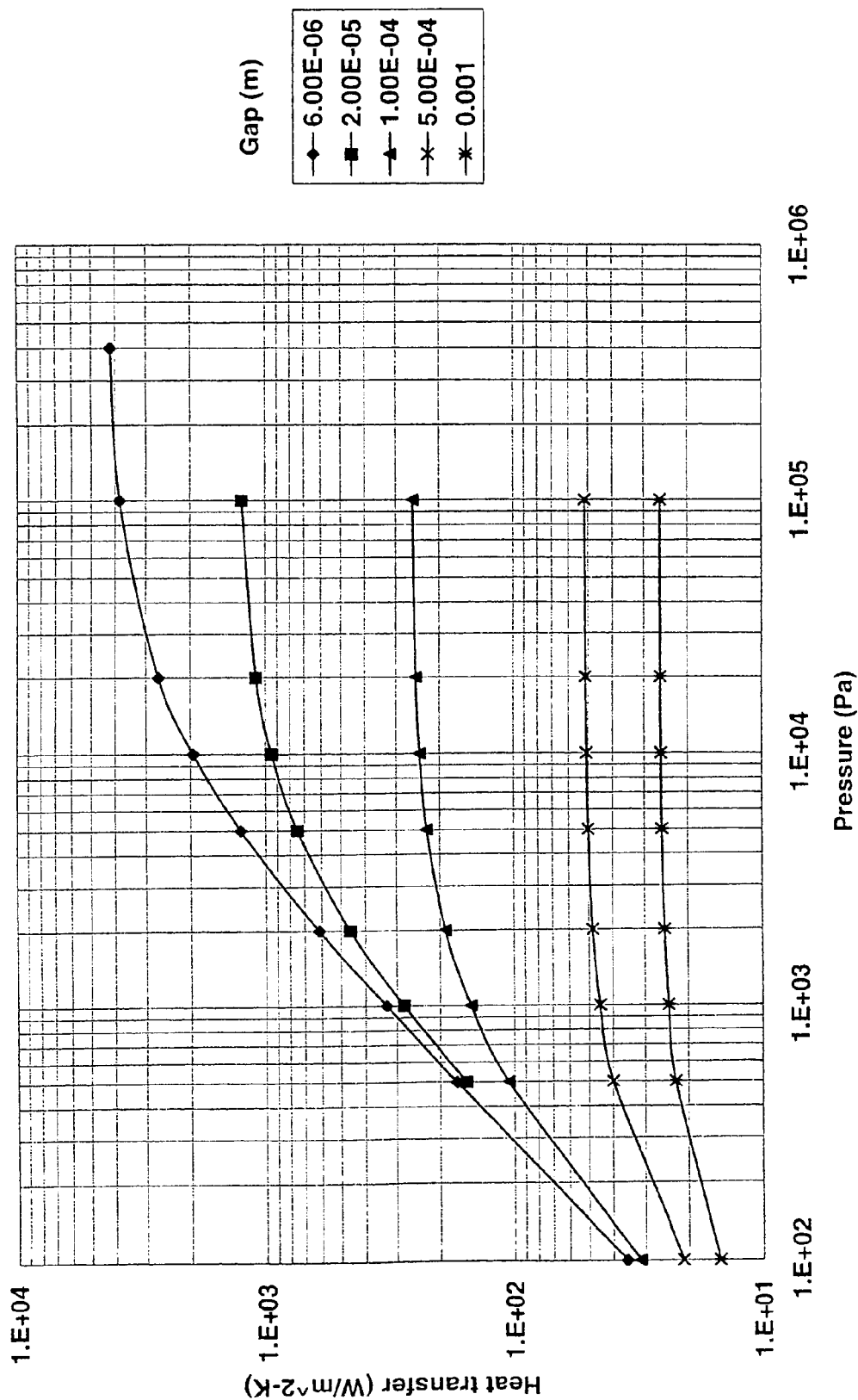
FIG. 7 is a graph showing the relationship between heat transfer through a gas, gas pressure, and gap dimension.

In one embodiment, heat is transferred primarily by conduction through the bearing fluid located within the stage gap 256 and the relief gap 262. In addition, a relatively small amount of heat is radiated between the heat transfer region 246 and facing surfaces of the slider region 258 and the relieved area 260C. The conductive heat transfer depends on fluid and surface properties, and on the fluid density, or equivalently its pressure, and the stage gaps 256 and the relief gap 262, as well as the temperature differences across the stage gaps 256 and relief gap 262. FIG. 7 illustrates the heat transfer rate for nitrogen gas as a function of fluid pressure for a number of gaps for one embodiment of a stage assembly. These results are derived from expressions in D. Wright et al, "Low temperature etch chuck: modeling and experimental results of heat transfer and wafer temperature", J. Vac. Sci. Technol., Vol. A10, 1065(1992). In this example, for the small gaps of 6 μm (6.00E-06) and 20 μm (2.00E-05), typical of stage gaps 256, the heat transfer is nearly independent of pressure for atmospheric pressure (approximately 1.E05 Pa) and above. For larger gaps, more typical of relief gaps 260C, the heat transfer is smaller but nearly independent of pressure for pressures as low as one tenth of atmospheric pressure or less. Since fluid bearings normally operate at pressures of several atmospheres, and the relieved area is normally maintained at atmospheric pressure or less, heat transfer in these regions typically is relatively insensitive to the pressure settings, Referring back to FIG. 2B, in one embodiment, the stage environmental system 226 directly controls the temperature of the heat transfer region 246, indirectly controls the temperature of the stage 238, and controls the amount of heat transferred from the stage 238 to the environment that surrounds the stage 238. In one embodiment, the stage environmental system 226 maintains a portion or the entire outer surface of the stage 238 at a set temperature.

The design of the stage environmental system 226 can vary. The stage environmental system 226 can include one or more fluid reservoirs (not shown), fluid pumps (not shown), and/or temperature adjusters (not shown) e.g. heat exchangers, chiller units, or heaters. In one embodiment, the temperature, flow rate, and type of circulation fluid 266 are selected and adjusted to precisely control the temperature of the heat transfer region 246 and/or the stage 238. In one embodiment, the circulation fluid 266 can be Flourinert type FC-77, made by 3M Company in Minneapolis, Minn. and/or R123, made by DuPont, located in Wilmington, Del.

For example, the flow rates and temperature of the circulation fluid 266 are controlled to maintain (i) the stage 238 at a predetermined temperature, or (ii) a predetermined temperature difference between the heat transfer region 246 and the slider regions 258. In alternative, non-exclusive embodiments, the temperature difference between the heat transfer region 246 and the slider regions 258 of the stage 238 is maintained at least approximately 0.5, 1, 2, 3, 5, 7, 10, 15, to 20° K. However, the temperature difference can be greater or less.

The amount of heat transferred from the slider regions 258 to the heat transfer region 246 can be controlled. FIG. 7 shows the heat transfer rate between the slider regions 258 and the heat transfer region 246 can be between approximately 1000 and 4000 W/m$^2$-K. The heat transfer rate between the relieved area 260C and the heat transfer region 246 can be between approximately 10 and 500 W/m$^2$-K. However, greater or lesser rates can be achieved.

With some of these designs, the bulk of the heat from the slider regions 258 is transferred via the bearing pads 260A, 260B and a portion of the heat is transferred via the relieved area 260C.

FIG. 2E is a table that lists modeling results for one embodiment. In this embodiment, the stage has a total slider region area of 0.4 m$^2$. Twenty-five percent of the internal area of the slider is separated from the guide beam by a stage gap of 6 μm; the rest has a gap of 1 mm. Heat transfer is calculated for three different gases Ar, He, and N2. The pressure in the bearing is 4×10$^5$ Pa or 4 atm, and the pressure in the relieved region is 130 Pa or approximately 1 Torr. In this embodiment, most of the heat transfer is in the bearing region.

In these embodiments, for a temperature difference of 10 K, a heat transfer of approximately 4.5 kW is possible with N2 gas, 3.0 kW with Ar and 26.4 kW with He.

In certain embodiments, because of the temperature differences between the slider regions 258 and the heat transfer regions 246, and because the stage gaps 256 are quite small, thermal expansion can cause the stage gaps 256 to change substantially. For example, in one embodiment, the stage gap 256 is approximately 3 microns when a temperature difference of 10 K is maintained between the slider regions 258 and the guide beam 244. If the guide beam 244 has a coefficient of thermal expansion of 3 ppm/K, and a transverse dimension of 0.2 m, the guide beam 244 will expand by 3×10$^{-6}$×0.2×10=6×10$^{-6}$ m=6 μm if the guide beam 244 warms up to the same temperature as the slider regions 258 (or the slider regions cool down to the guide beam temperature), so that the stage gap 256 disappears. Thus, care must be taken in the design to avoid seizing of the bearing 254B. A number of means are possible, including: (i) the bearing 254B clearances are chosen large enough to avoid seizure; (ii) the materials are chosen with small coefficients of expansion; (iii) maximum bearing transverse dimensions are limited; (iv) at one extreme of position along the path of the stage 238 relative to the guide beam 244, e.g. the load position, the stage gaps 256 are greater, so that the stage 238 could be safely parked there even if the intended temperature difference is not maintained; and/or (v) the maximum temperature difference is limited by the existing bearing dimensions and gaps.

Additionally, in one embodiment, the stage 238 can include one or more heat transferers 268 for transferring heat from one or more portions of the stage 238 to the slider regions 258. The design, number and location of the heat transferers 268 can vary. For example, each heat transferer 268 can have a first end 268A that is positioned near the heat source and a second end 268B that is positioned near the slider region 258. In this embodiment, each heat transferer 268 can be a solid beam or structure that is formed from a suitable material that has a relatively high thermal conductivity. For example, in alternative embodiments, the material in the heat transferer 268 can have a thermal conductivity of at least approximately 50 watts per meter degree Kelvin (W/m-K), 100 W/m-K, 200 W/m-K, or 300 W/m-K. Examples of materials that satisfy these desired thermal conductivity ranges, along with their approximate thermal conductivity values, include aluminum (237 W/m-K), gold (317 W/m-K), copper (401 W/m-K) and silver (429 W/m-K). Alternately, other suitable materials having thermal conductivities in the ranges provided herein can be used.

The heat transfer capability of a heat transferer 268 may be compared with the heat transfer capability of the gas in the stage gap 256 and the relief gap 262, as described above in connection with the data in FIG. 2E. If the heat transferer 268 has a thermal conductivity of 100 W/m-K, transverse area 0.1 m$^2$, distance between the first end 268A and second end 268B of 0.1 m, and temperature difference of 1 K between first end 268A and second end 268B, the heat transfer is 100 W/m-K×0.1 m$^2$×1 K/0.1 m=100 W. This is adequate for many applications, but it is substantially less than the heat transfer described above in connection with the example in FIG. 2E. Therefore in this example, the temperature difference of 10 K between the slider regions 258 and the guide beam 244 could be reduced without significantly affecting the net heat transfer from the stage mover assembly 240. This in turn reduces concerns about thermal expansion effects causing seizure of the bearing 254B.

In one embodiment, each heat transferer 268 is not in electrical contact with and is electrically isolated from any electrical components on the stage 238. In another embodiment, at least one of the heat transferers 268 is a heat pipe. In yet another embodiment, the heat transferer includes a pump that moves a fluid between one or more hot portions of the stage 238 and the slider regions 258.

Figure 2C:
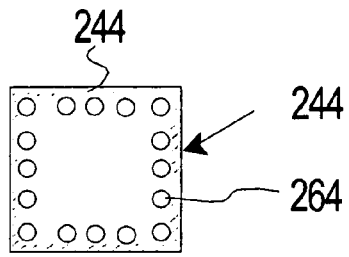
FIG. 2C is a cut-away view taken on line 2C-2C in FIG. 2A with the bearing supply.

FIG. 2C is a cross-sectional view from FIG. 2A. FIG. 2C illustrates that in this embodiment, the guide beam 244 includes a plurality of spaced apart circulation passageways 264 that are positioned around the perimeter of the guide beam 244. Additionally, the heat transfer region 246 is illustrated as cross-hatching in FIG. 2C. The circulation passageways 264 can extend the length of the guide beam 244 or just a portion of the guide beam 244.

The size of each of the circulation passageways 264 can vary. The location of the inlets and the outlets into the circulation passageways 264 can be changed to influence the cooling of the heat transfer region 246.

Figure 2D:
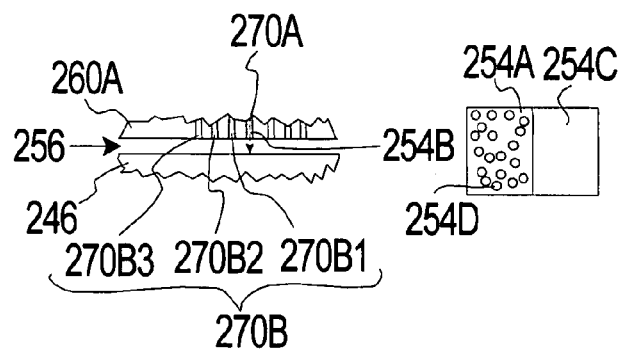
FIG. 2D is a simplified side illustration of a portion of a bearing pad and the bearing supply.

Additionally, the guide beam 244 can include one or more passageways (not shown) for the bearing fluid 254D (illustrated in FIG. 2D).

FIG. 2D illustrates a portion of the heat transfer region 246, one bearing pad 260A and a portion of the stage gap 256 in more detail. In this embodiment, the bearing 254B is a vacuum compatible fluid type bearing that is designed to minimize the amount of bearing fluid that is released into the surrounding environment. In this embodiment, the bearing pad 260A includes a fluid outlet 270A in fluid communication with the bearing fluid supply 254A and a plurality of fluid ducts 270B surrounding the bearing pad 256 that are in fluid communication with a bearing recovery system 254C. To create the bearing 254B, the bearing fluid supply 254A forces a bearing fluid 254D (illustrated as circles) from the fluid outlet 270A towards the heat transfer region 246, and the bearing recovery system 254C removes the bearing fluid 254D from the fluid ducts 270B. In one embodiment, the bearing recovery system 254C connects each successive fluid duct 270B1, 270B2, 270B3 to recovery units maintained at successively lower pressures, in order to recover most of the bearing fluid 254D released from the fluid outlet 270A and minimize the bearing fluid 254D that exits the stage gap 256 into the environment. Such recovery can be accomplished without connecting hoses to moving stage 238, by exhausting the fluids from fluid ducts 270B1, 270B2, 270B3 into chambers internal to guide beam 244, through openings in the surface of guide beam 244. The chambers internal to guide beam 244 are evacuated by means of vacuum pumps. This art is described in U.S. Pat. Nos. 6,467,960, 6,499,880, and 6,735,867. With this design, heat from the bearing pad 260A is conducted effectively through the bearing fluid 254D, and if the stage gap 256 between is small enough the heat transfer can be substantial.

In this embodiment, although the bearing pads are proposed as the primary heat transfer surface, other surfaces in close proximity can be used. These might have a labyrinth geometry, so the total surface area is increased.

Figure 3:
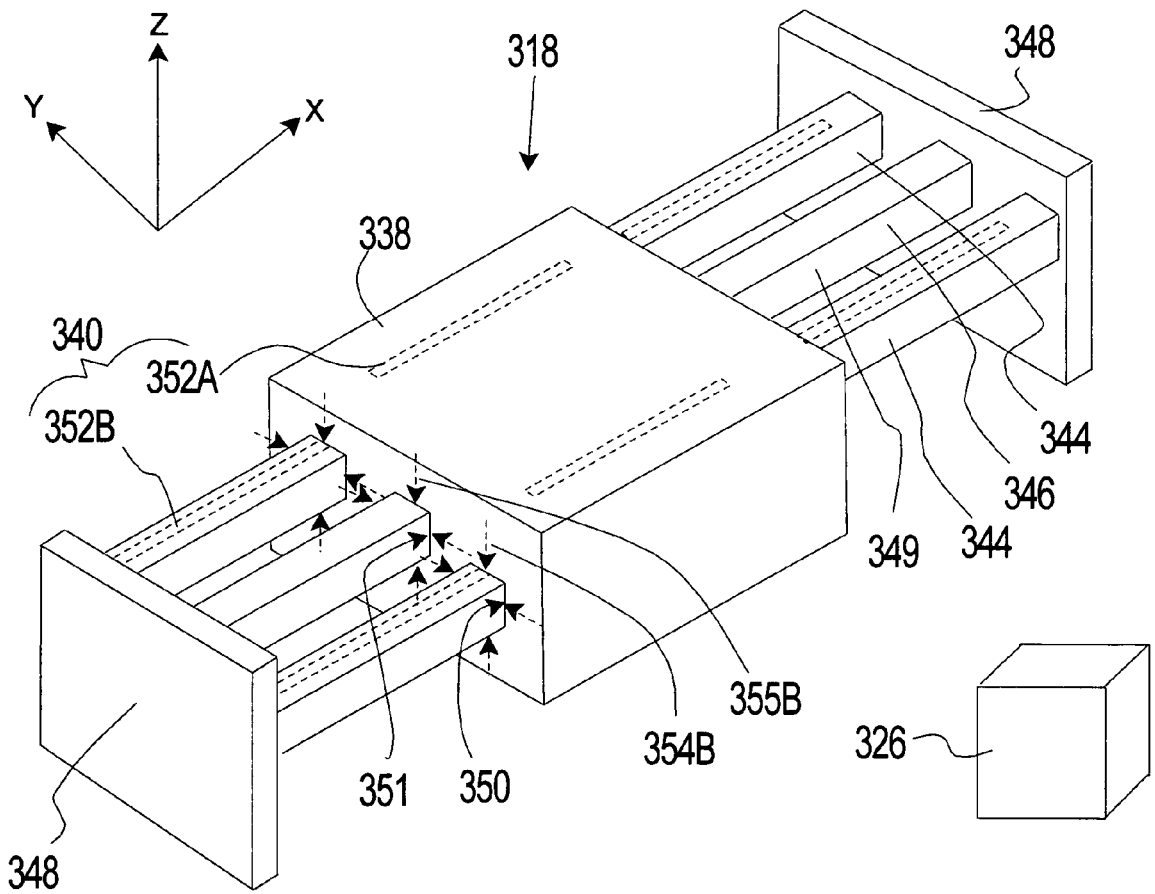
FIG. 3 is a perspective view of another embodiment of a stage assembly.

FIG. 3 illustrates a perspective view of a second embodiment of a stage assembly 318 having features of the present invention. The chuck and the device are not illustrated in FIG. 3. The stage assembly 318 can be used as the first stage assembly 18A or the second stage assembly 18B described above and illustrated in FIG. 1. Alternatively, the stage assembly 318 can be used to move other types of devices during manufacturing and/or inspection, to move a device under an electron microscope (not shown), or to move a device during a precision measurement operation (not shown).

In FIG. 3, the first stage assembly 318 includes (i) the stage 338, (ii) the stage mover assembly 340 (illustrated in phantom) that moves and positions the stage 338, (iii) a pair of spaced apart guide beams 344, (iv) a heat transfer beam 349 that defines the heat transfer region 346, and (v) the spaced apart beam supports 348. In this embodiment, the stage 338 is generally rectangular block shaped and includes two stage apertures 350 and one transfer region aperture 351 that extend transversely through the stage 338. The stage apertures 350 and the guide beams 344 may be rectangular shaped or they may be of a different shape. For example they may be cylindrical shaped. Also the heat transfer beam 349 and transfer region aperture 351 may be rectangular shaped or they may be of a different shape. For example they may be cylindrical shaped.

The stage mover assembly 340 is somewhat similar to the corresponding component described above. In this embodiment, the actuator electrical conductor components 352B are secured to both guide beams 344 and the magnet components 352A are secured to the stage 338.

In an alternative embodiment, for example, (i) one of the components 352B, 352A is secured to two other beams (not shown) that extend parallel with the guide beams 344 and (ii) the other component 352A, 352B is secured to the stage 338. With this design, reaction forces generated by the stage mover assembly 340 are not transferred to the guide beams 344.

In FIG. 3, the guide beams 344 guide the motion of the stage 338 and a beam bearing 354B maintains a beam stage gap between the stage 338 and the guide beams 344. Further, in one embodiment, a region bearing 355B maintains a region stage gap between the stage 338 and the heat transfer beam 349. In this embodiment, the region stage gap at the bearings 355B act as the conductive path from the stage 338 to the heat transfer region 346. For example, each bearing 354B, 355B can be a fluid type bearing. Alternatively, for example, a magnetic type bearing or a ball or roller bearing type assembly could be utilized for beam bearing 354B that allows for motion of the stage 338 relative to the guide beams 344.

In one embodiment, the heat transfer region 346 is cooled by the stage environmental system 326. In one embodiment, the heat transfer beam 349 includes a plurality of spaced apart circulation passageways distributed around the perimeter of the heat transfer beam 349. In this embodiment, the stage environmental system 326 directs a circulation fluid to directly control the temperature of the heat transfer region 346. The stage environmental system 326 can be similar in design as the corresponding component described above. Additionally, in one embodiment, the stage 338 can include one or more heat transferers (not shown) for transferring heat from one or more portions of the stage 338 to the heat transfer region 346.

In one embodiment, the region stage gap is larger than the beam stage gap. With this design, the relative rates of thermal expansion are less problematic because the region stage gap is larger. In alternative, non-exclusive embodiments, the beam stage gap is between approximately 3 μm and 20 μm and the region stage gap is between approximately 50 μm and 5 mm. Further, the local pressure in the region stage gap can be less than the pressure in the beam stage gap so the region bearing 355B has little influence on the beam bearing 354B performance.

Figure 4:
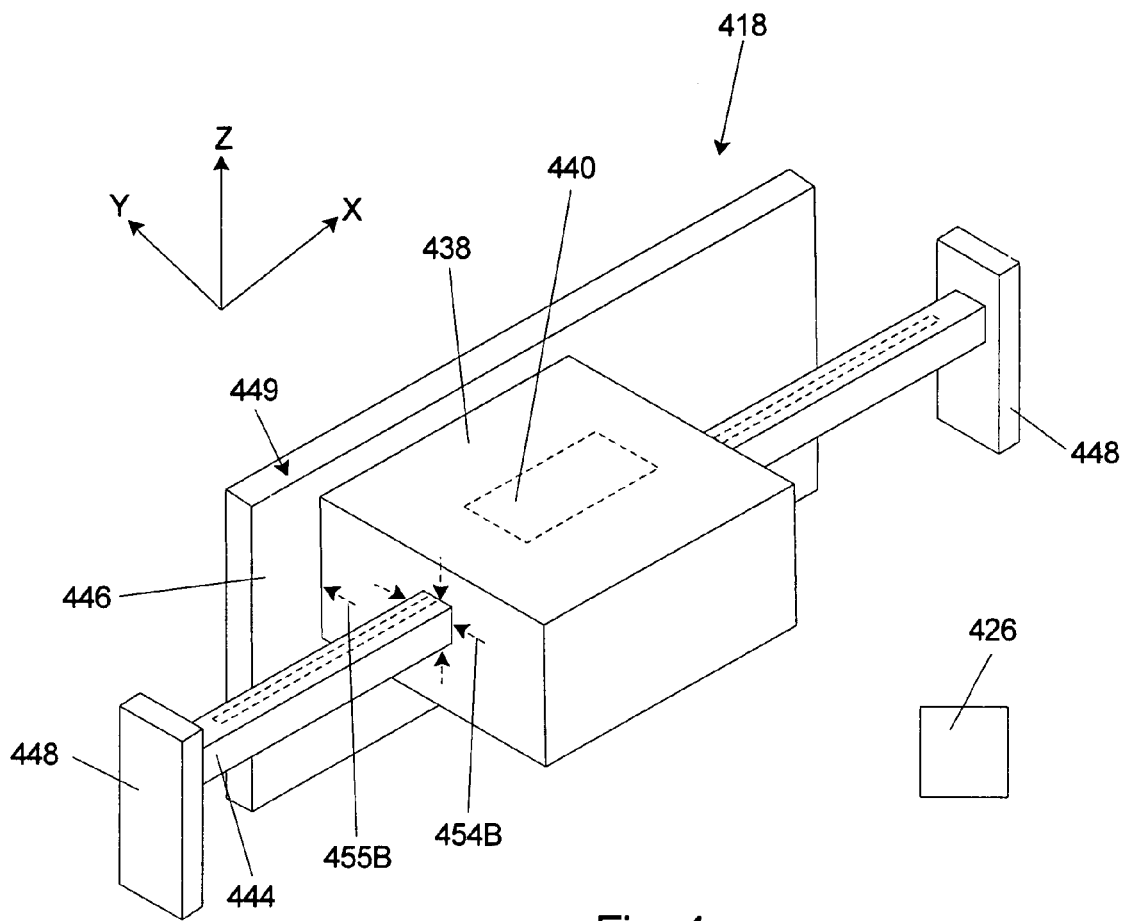
FIG. 4 is a perspective view of yet another embodiment of a stage assembly.

FIG. 4 illustrates a perspective view of yet another embodiment of a stage assembly 418 having features of the present invention. The chuck and the device are not illustrated in FIG. 4. The stage assembly 418 can be used as the first stage assembly 18A or the second stage assembly 18B described above and illustrated in FIG. 1. Alternatively, the stage assembly 418 can be used to move other types of devices during manufacturing and/or inspection, to move a device under an electron microscope (not shown), or to move a device during a precision measurement operation (not shown).

In FIG. 4, the first stage assembly 418 includes (i) the stage 438, (ii) the stage mover assembly 440 (illustrated in phantom) that moves and positions the stage 438, (iii) a guide beam 444, (iv) a heat transfer plate 449 that defines the heat transfer region 446, and (v) the spaced apart beam supports 448. In this embodiment, the heat transfer plate 449 is positioned adjacent to one side of the stage 438 and the stage 438 is moved relative to the heat transfer plate 449. Alternatively, heat transfer plate 449 could also be placed above or below stage 438.

In FIG. 4, the guide beam 444 guides the motion of the stage 438 and a beam bearing 454B maintains a beam stage gap between the stage 438 and the guide beam 444. Further, in one embodiment, a region bearing 455B maintains a region stage gap between the stage 438 and the heat transfer plate 449. In this embodiment, the region bearings 455B act as the conductive path from the stage 438 to the heat transfer region 446. For example, each bearing 454B, 455B can be a fluid type bearing. Alternatively, for example, a magnetic type bearing or a ball or roller bearing type assembly could be utilized for beam bearing 454B that allows for motion of the stage 438 relative to the guide beam 444.

In one embodiment, the heat transfer region 446 is cooled by the stage environmental system 426. In one embodiment, the heat transfer plate 449 includes a plurality of spaced apart circulation passageways. Further, in this embodiment, the stage environmental system 426 directs a circulation fluid to directly control the temperature of the heat transfer surface 446. The stage environmental system 426 can be similar in design as the corresponding component described above. Additionally, in one embodiment, the stage 438 can include one or more heat transferers (not shown) for transferring heat from one or more portions of the stage 438 to the heat transfer region 446.

In one embodiment, the region stage gap is larger than the beam stage gap. With this design, the relative rates of thermal expansion are less problematic because the region stage gap is larger.

Figure 5:
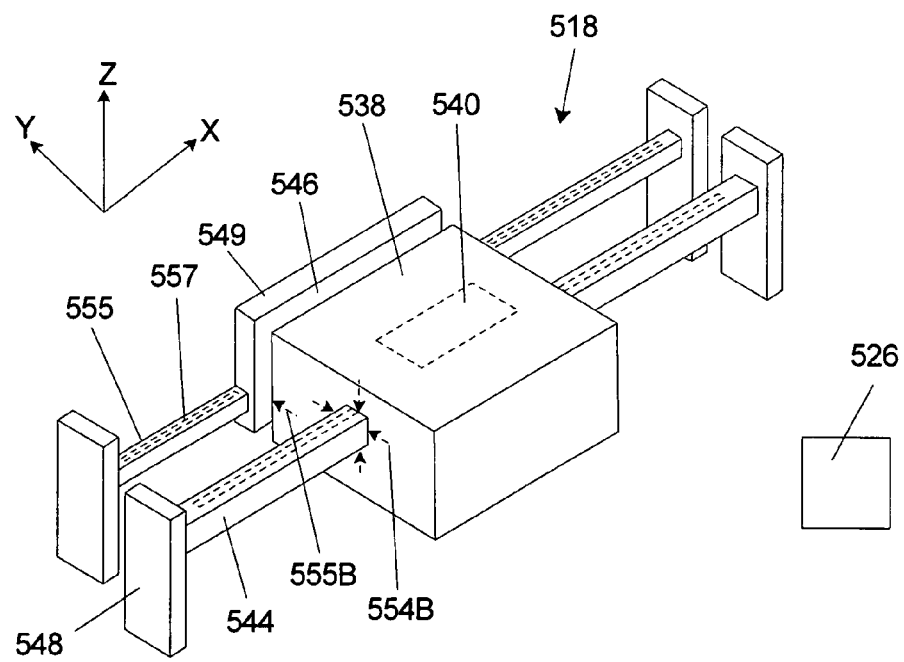
FIG. 5 is a perspective view of still another embodiment of a stage assembly.

FIG. 5 illustrates a perspective view of yet another embodiment of a stage assembly 518 having features of the present invention. The chuck and the device are not illustrated in FIG. 5. The stage assembly 518 can be used as the first stage assembly 18A or the second stage assembly 18B described above and illustrated in FIG. 1. Alternatively, the stage assembly 518 can be used to move other types of devices during manufacturing and/or inspection, to move a device under an electron microscope (not shown), or to move a device during a precision measurement operation (not shown).

In FIG. 5, the first stage assembly 518 includes (i) the stage 538, (ii) the stage mover assembly 540 (illustrated in phantom) that moves and positions the stage 538, (iii) a guide beam 544, (iv) a heat transfer plate 549 that defines the heat transfer region 546, (v) a transfer guide 555, (vi) a transfer mover assembly 557, and (vii) the spaced apart beam supports 548.

In FIG. 5, the guide beam 544 guides the motion of the stage 538 and a beam bearing 554B maintains a beam stage gap between the stage 538 and the guide beams 544. Further, in one embodiment, a region bearing 555B maintains a region stage gap between the stage 538 and the heat transfer plate 549. In this embodiment, the region bearings 555B acts as the conductive path from the stage 538 to the heat transfer region 546. In this embodiment, the heat transfer plate 549 is positioned adjacent to one side of the stage 538. Alternatively, heat transfer plate 549 could also be placed above or below stage 538.

Moreover, in this embodiment, the transfer guide 555 guides the movement of the heat transfer plate 549 and the transfer mover assembly 557 moves the heat transfer plate 549. In one embodiment, the transfer mover assembly 557 is controlled to move the heat transfer plate 549 substantially concurrently to follow and track the movement of the stage 538. With this design, the plate 549 is moved to be adjacent to the stage 538.

In one embodiment, the heat transfer region 546 is cooled by the stage environmental system 526. In this embodiment, the stage environmental system 526 directs a circulation fluid to directly control the temperature of the heat transfer region 546. Additionally, in one embodiment, the stage 538 can include one or more heat transferers (not shown) for transferring heat from one or more portions of the stage 538 to the heat transfer region 546.

In one embodiment, the region stage gap is larger than the beam stage gap. With this design, the relative rates of thermal expansion are less problematic because the region stage gap is larger.

Figure 6A:
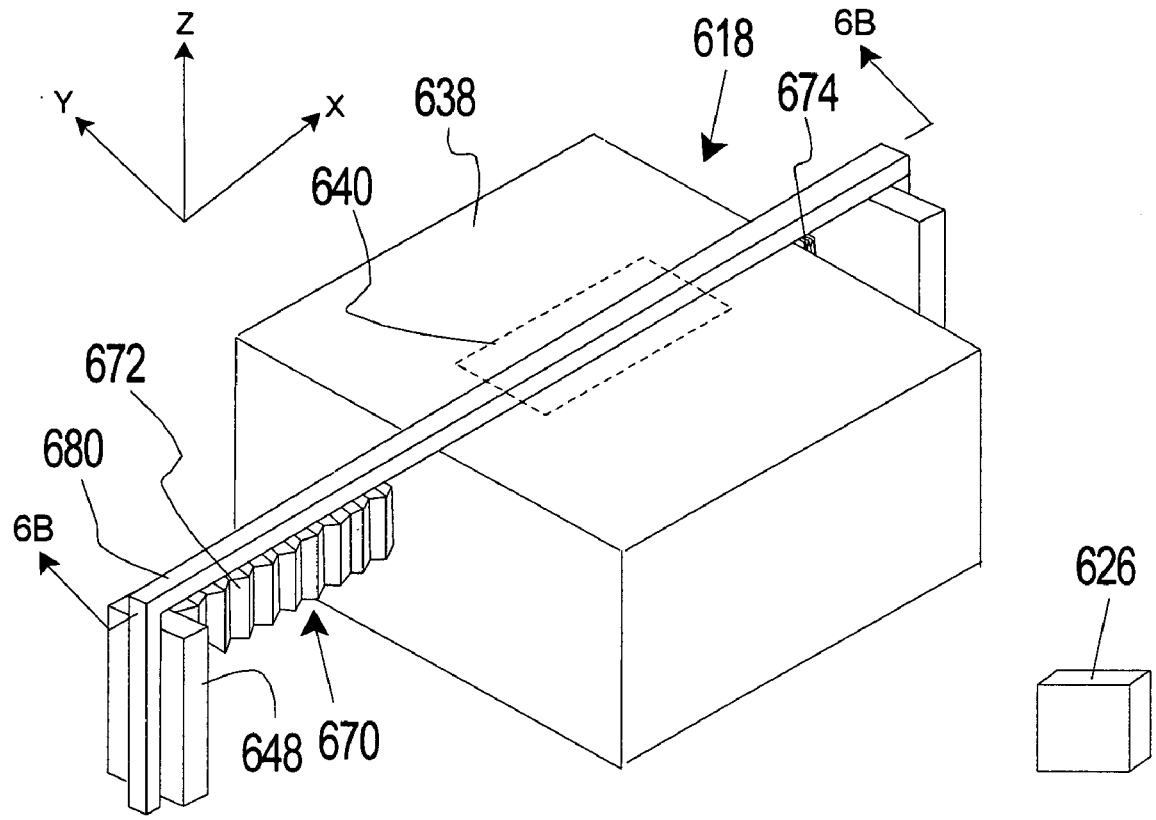
FIG. 6A is a perspective view of another embodiment of a stage assembly.
Figure 6B:
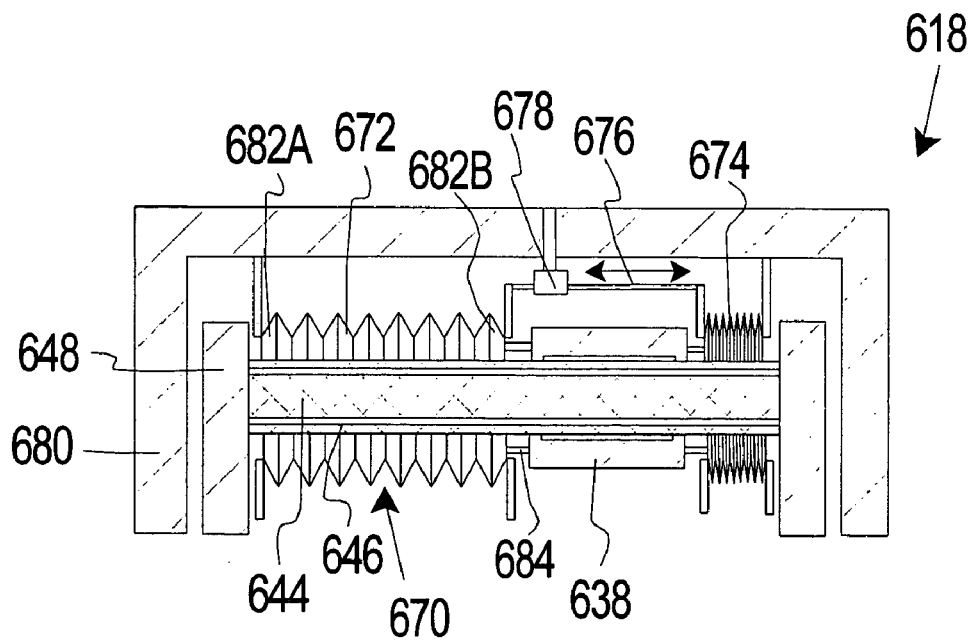
FIG. 6B is a cut-away view taken on line 6B-6B in FIG. 6A.

FIG. 6A illustrates a perspective view of yet another embodiment of a stage assembly 618 having features of the present invention, and FIG. 6B illustrates a cutaway view taken on line 6B-6B in FIG. 6A. The chuck and the device are not illustrated in FIGS. 6A and 6B. The stage assembly 618 can be used as the first stage assembly 18A or the second stage assembly 18B described above and illustrated in FIG. 1. Alternatively, the stage assembly 618 can be used to move other types of devices during manufacturing and/or inspection, to move a device under an electron microscope (not shown), or to move a device during a precision measurement operation (not shown).

In FIGS. 6A and 6B, the stage assembly 618 includes (i) the stage 638, (ii) the stage mover assembly 640 (illustrated in phantom) that moves and positions the stage 638, (iii) a guide beam 644 that defines the heat transfer region 646, (iv) the spaced apart beam supports 648, and (v) the stage environmental system 626. In this embodiment, the stage assembly 618 is similar to the stage assembly 218 illustrated in FIG. 2A. However, in this embodiment, the stage assembly 618 includes a shield assembly 670 that reduces the amount of heat transfer between the heat transfer region 646 and the surrounding environment. Stated another way, the shield assembly 670 surrounds the guide beam 644 and heat transfer region 646, and shields the rest of the local environment from the lower temperature of the heat transfer region 646.

In one embodiment, the shield assembly 670 includes a flexible, first thermal shield 672, a flexible, second thermal shield 674, a shield connector 676, a shield mover assembly 678, and a shield frame 680.

In FIGS. 6A and 6B, the first thermal shield 672 is positioned on one side of the stage 638 and the second thermal shield 674 is positioned on the opposite side of the stage 638. Moreover, each thermal shield 672, 674 is generally tubular shaped, and encircles the heat transfer region 646. In one embodiment, each thermal shield 672, 674 is generally rectangular tube shaped and includes a plurality of bellows. In one embodiment, each thermal shield 672, 674 is made of a thin material, with a low thermal emissivity coefficient, so that little heat transfer occurs between the shield 672, 674 and either the heat transfer region 646 or the local environment.

In one embodiment, each thermal shield 672, 674 includes a distal end 682A that is secured to the shield frame 680 near the beam support 648 and a proximal end 682B. The shield connector 676 connects the proximal ends 682B of the thermal shields 672, 674 together. In one embodiment, the shield frame 680 is a rigid beam and the shield connector 676 is a rigid beam.

The shield mover assembly 678 moves the proximal ends 682B of the thermal shields 672, 674 to follow and shadow the movement of the stage 638. More specifically, as the stage mover assembly 640 moves the stage 638, the shield mover assembly 678 is driven so that the proximal end 682B of each shield 672, 674 is positioned near the stage 638. In one embodiment, the shield mover assembly 678 moves the shield connector 676 and the proximal ends 682B. With this design, any vibration from the shield assembly 670 is inhibited from being transferred to the stage 638.

Alternatively, for example, the distal end 682A of each thermal shield 672, 674 can be secured to one of the beam supports 648 and/or the proximal end 682B of each thermal shield 672, 674 can be secured to the stage 638.

Additionally, in one embodiment, the stage 638 can include a plurality of spaced apart projections 684 that reduces the amount of heat transfer region 646 that is directly exposed to the surrounding environment.

Figure 8A:
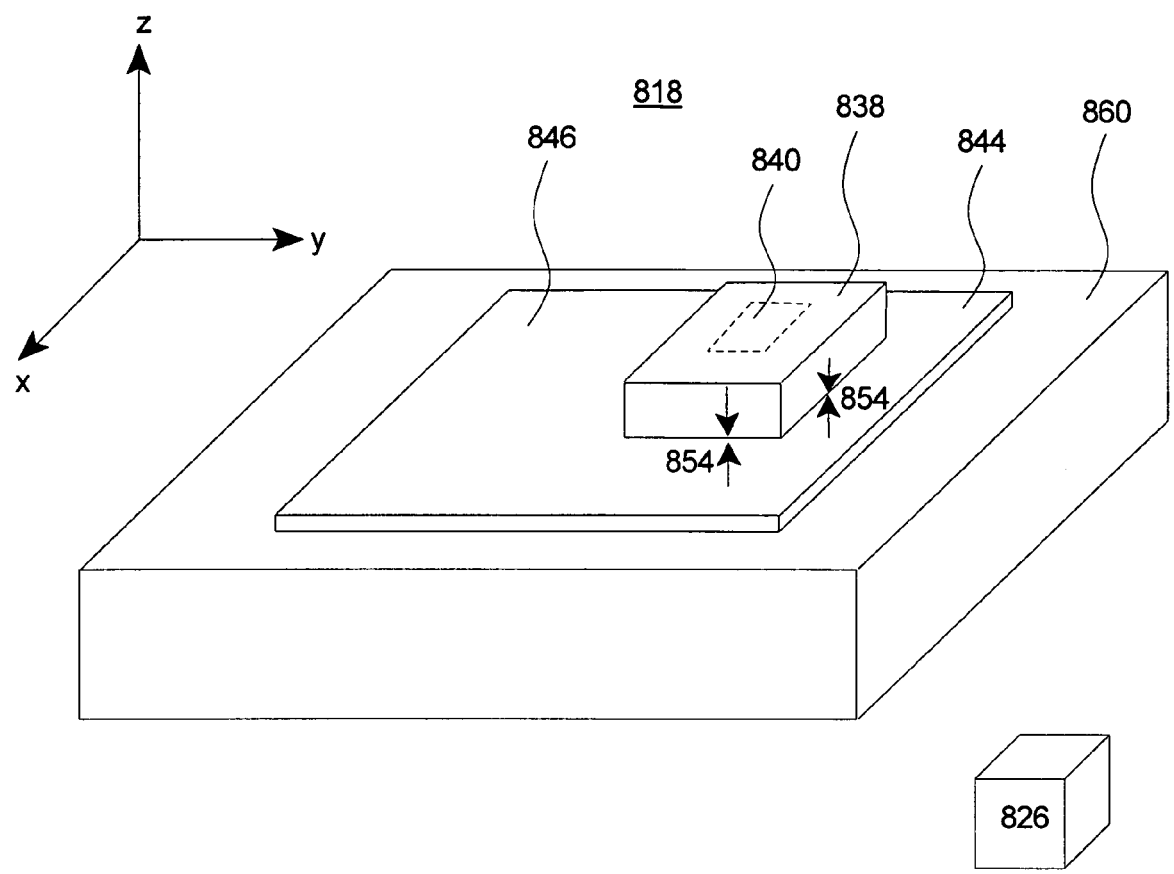
FIG. 8A is a perspective view of another embodiment of a stage assembly.

FIG. 8A illustrates a perspective view of another embodiment of a stage assembly 818 having features of the present invention. The chuck and the device are not illustrated in FIG. 8A. The stage assembly 818 can be used as the first stage assembly 18A or the second stage assembly 18B described above and illustrated in FIG. 1. Alternatively, the stage assembly 918 can be used to move other types of devices during manufacturing and/or inspection, to move a device under an electron microscope (not shown), or to move a device during a precision measurement operation (not shown).

In FIG. 8A, the first stage assembly 818 includes (i) the stage 838, (ii) the stage mover assembly 840 (illustrated in phantom) that moves and positions the stage 838 in the XY plane, (iii) a guide plate 844 that includes a heat transfer region 846, and (iv) a base support 860. In this embodiment, the guide plate 844 is positioned beneath the stage 838, and the stage 838 is moved relative to the guide plate 844.

In FIG. 8A, the guide plate 844 limits the motion of the stage 838 to the XY plane and a plate bearing 854 (illustrated as arrows) maintains a plate stage gap between the stage 838 and the guide plate 844. In this embodiment, the plate bearing 854 acts as the thermal conductive path from the stage 838 to the heat transfer region 846. For example, the plate bearing 854 can be a fluid type bearing.

In one embodiment, the stage mover assembly 840 is a planer type motor that includes a magnet array and a conduction array. With this design, one the arrays is secured to the stage 838 and the other array is secured to the guide plate 844 or the base support 860.

Figure 8B:
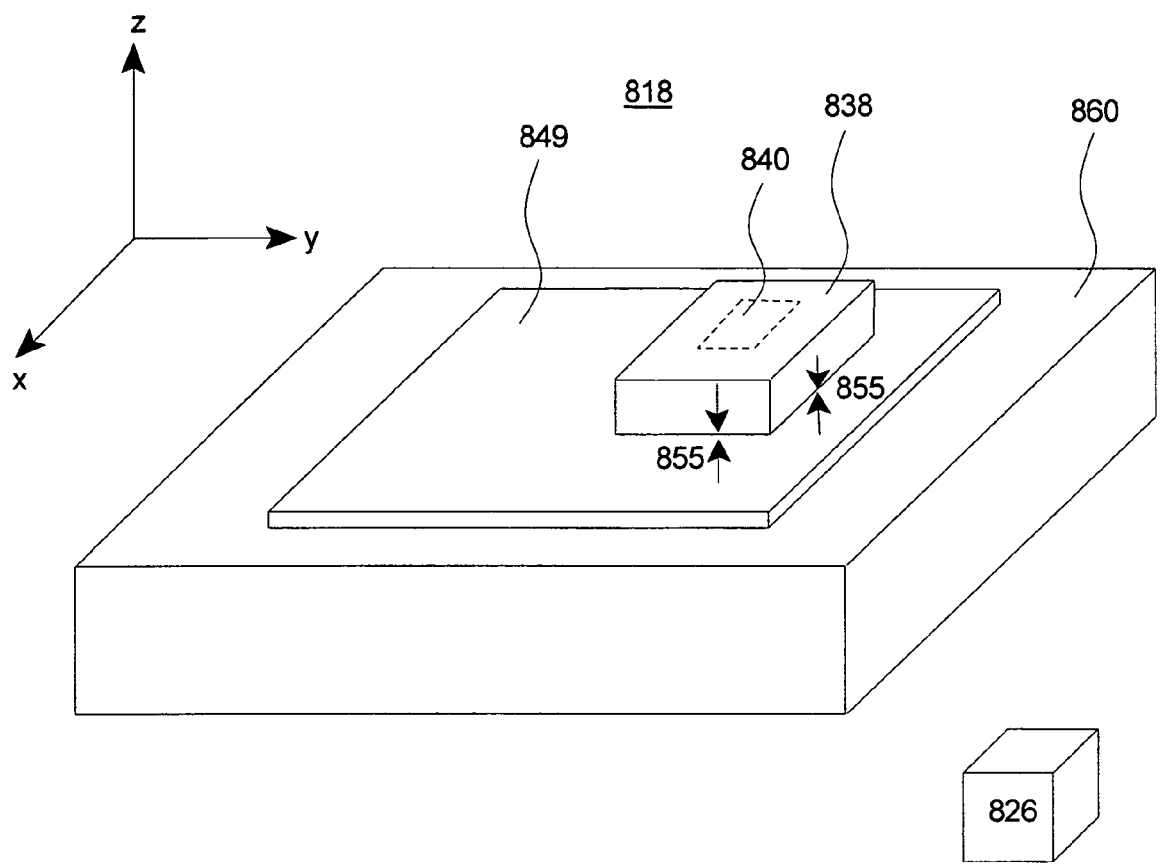
FIG. 8B is a perspective view of yet another embodiment of a stage assembly.

In another embodiment, shown in FIG. 8B, guide beams (not shown) guide the stage assembly 838 in the XY plane. A region bearing 855 maintains a region stage gap between the stage 838 and the heat transfer plate 849. For example, region bearing 855 can be a fluid type bearing. In this embodiment, the region bearing 855 acts as the thermal conductive path from the stage 838 to the heat transfer region 846.

In one embodiment, the heat transfer region 846 is cooled by the stage environmental system 826. In the embodiment of FIG. 8A, the guide plate 844 includes a plurality of spaced apart circulation passageways. In the embodiment of FIG. 8B, the heat transfer plate 849 includes a plurality of spaced apart circulation passageways. Further, in this embodiment, the stage environmental system 826 directs a circulation fluid to directly control the temperature of the heat transfer surface 846. The stage environmental system 826 can be similar in design as the corresponding component described above. Additionally, in one embodiment, the stage 838 can include one or more heat transferers (not shown) for transferring heat from one or more portions of the stage 838 to the heat transfer region 846. Further, in other embodiments, guide plate 844 or heat transfer plate 849 may be thermally isolated from base support 860 by a layer of material (not shown) of low thermal conductivity, since base support 860 may desirably be maintained at a temperature different from that of guide plate 844 or heat transfer plate 849.

Figure 8C:
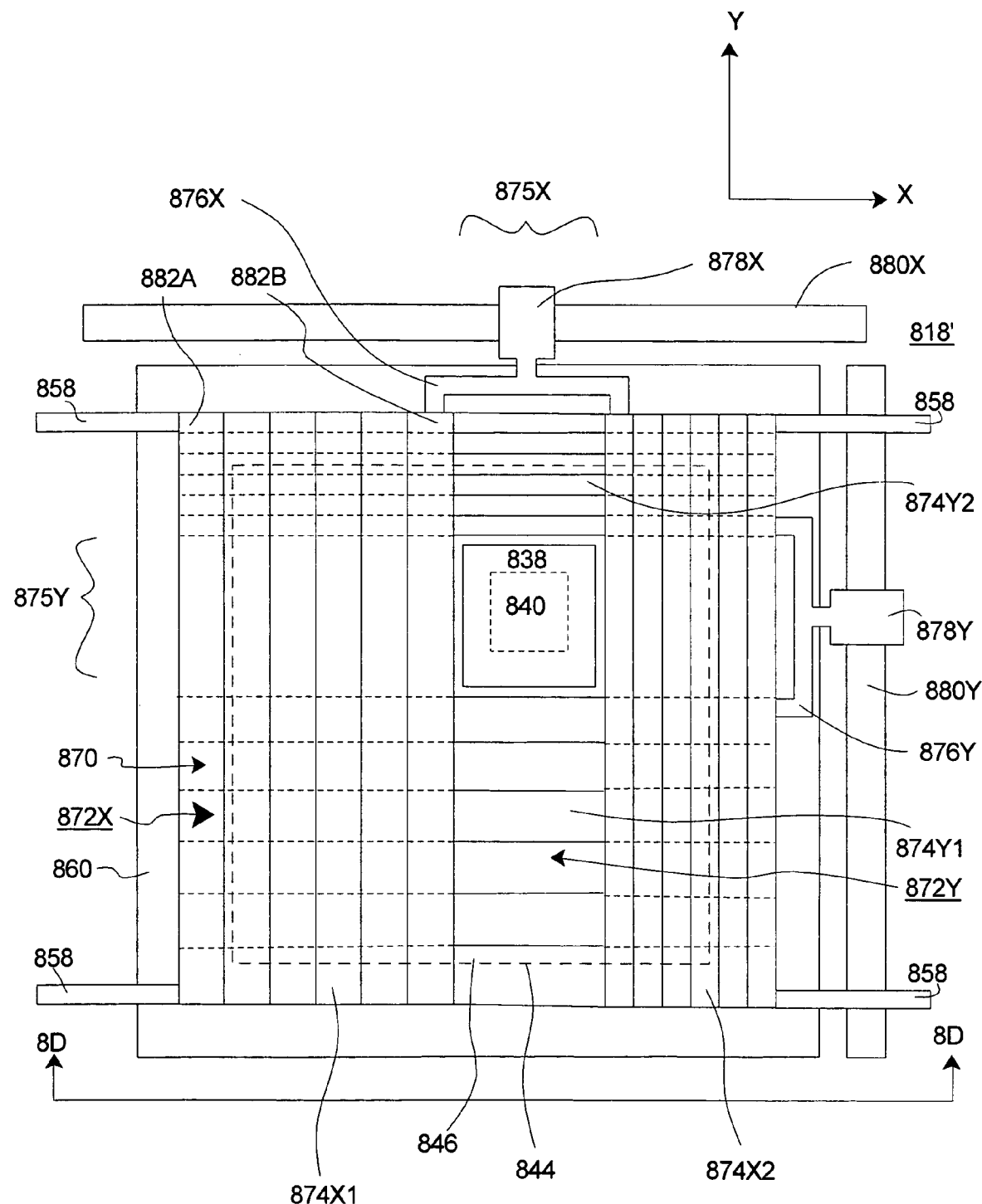
FIG. 8C is a top view of another embodiment of a stage assembly.
Figure 8D:
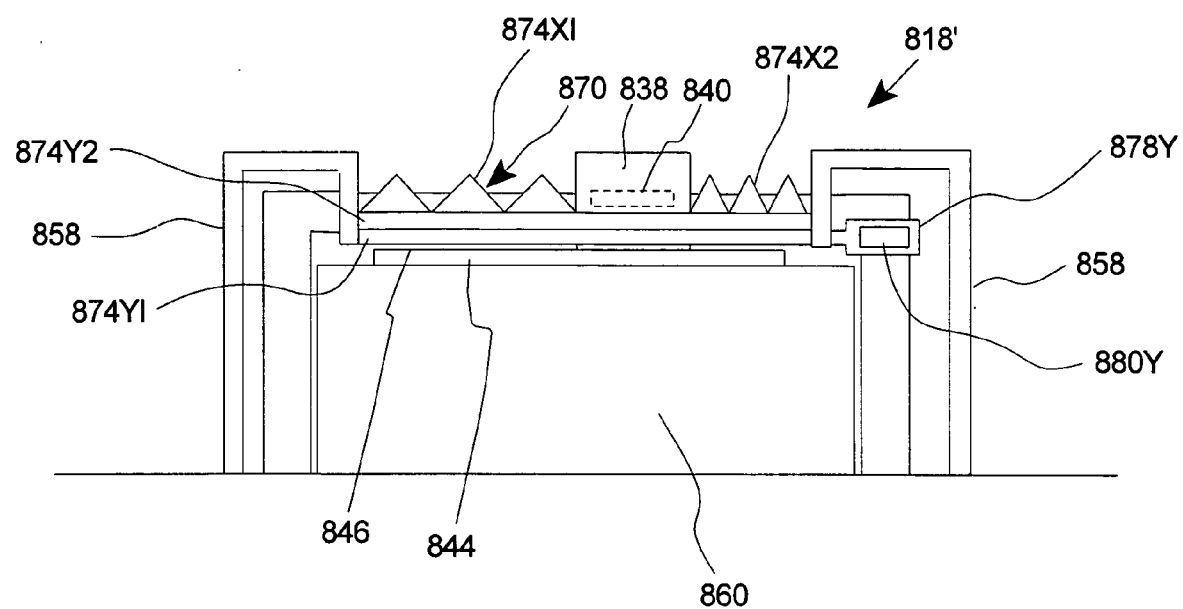
FIG. 8D is a side view taken along line 8D-8D in FIG. 8C.

FIG. 8C illustrates a top view of yet another embodiment of a stage assembly 818' having features of the present invention, and FIG. 8D illustrates a side view taken on line 8D-8D in FIG. 8C. The chuck and the device are not illustrated in FIGS. 8C and 8D. The stage assembly 818' can be used as the first stage assembly 18A or the second stage assembly 18B described above and illustrated in FIG. 1. Alternatively, the stage assembly 818' can be used to move other types of devices during manufacturing and/or inspection, to move a device under an electron microscope (not shown), or to move a device during a precision measurement operation (not shown).

In FIGS. 8C and 8D, the stage assembly 818' includes (i) the stage 838, (ii) the stage mover assembly 840 (illustrated in phantom) that moves and positions the stage 838 in the XY plane, (iii) a guide plate 844 that includes a heat transfer region 846, and (iv) a base support 860. In this embodiment, the stage assembly 818' is similar to the stage assembly 818 illustrated in FIG. 8A. However, in this embodiment, the stage assembly 818' includes a shield assembly 870 that reduces the amount of heat transfer between the heat transfer region 846 and the surrounding environment. Stated another way, the shield assembly 870 covers the guide plate 844 and heat transfer region 846, and shields the local environment above the base support 860 and guide plate 844 from the different temperature of the heat transfer region 846.

In one embodiment, the shield assembly 870 includes a flexible, first thermal shield assembly 872X and a flexible, second thermal shield assembly 872Y. First thermal shield assembly 872X includes a first flexible shield 874X1, a second flexible shield 874X2, a shield connector 876X, a shield mover assembly 878X, and a shield frame 880X. Similarly, second thermal shield assembly 872Y also includes a first flexible shield 874Y1, a second flexible shield 874Y2, a shield connector 876Y, a shield mover assembly 878Y, and a shield frame 880Y.

In FIGS. 8C and 8D, thermal shield 874X1 of first thermal shield assembly 672X is positioned on a first side of the stage 838 and second thermal shield 874X2 is positioned on an opposite side of the stage 838. Moreover, each thermal shield 674X1, 674X2 is pleated, and together they cover the heat transfer region 846, aside from a region 875X which is partially covered by stage 838. In one embodiment, each thermal shield 874X1, 874X2 is made of a thin material, with a low thermal emissivity coefficient, so that little heat transfer occurs between the shield 874X1, 874X2 and either the heat transfer region 846 or the local environment. Similarly, thermal shield 874Y1 of second thermal shield assembly 872Y is positioned on a third side of the stage 838 and the second thermal shield 874Y2 is positioned on an opposite side of the stage 838. The shapes and material properties of thermal shields 874Y1 and 874Y2 are similar to those of thermal shields 874X1 and 874X2. Together shields 874Y1 and 874Y2 cover the heat transfer region 846, aside from a region 875Y which is partially covered by stage 838.

In one embodiment, each thermal shield 874X1, 874X2, 874Y1, 874Y2 includes a distal end 882A that is secured to a shield support 858 and a proximal end 882B. The shield connector 876X connects the proximal ends 882B of the thermal shields 874X1, 874X2 together. Similarly, shield connector 876Y connects the proximal ends 882B of thermal shields 874Y1, 874Y2 together. In one embodiment, the shield frames 880X, 880Y are rigid beams and shield connectors 876X, 876Y are rigid beams.

The shield mover assemblies 878X, 878Y move the proximal ends 882B of the thermal shields 874X1, 874X2, 874Y1, 874Y2 to follow and shadow the movement of the stage 838. More specifically, as the stage mover assembly 840 moves the stage 838, the shield mover assemblies 878X, 878Y are driven so that the proximal end 882B of each shield 874X1, 874X2, 874Y1, 874Y2 is positioned near the stage 838. In one embodiment, the shield mover assemblies 878X, 878Y move the shield connectors 876X, 876Y and the proximal ends 682B. With this design, any vibration from the shield assembly 870 is inhibited from being transferred to the stage 838.

Alternatively, for example, the distal end 882A of each thermal shield 874X1, 874X2, 874Y1, 874Y2 can be secured to base support 860 and/or the proximal end 682B of each thermal shield 874X1, 874X2, 874Y1, 874Y2 can be secured to the stage 838.

It should be noted that the stage assemblies described herein can be used in a vacuum, or other environment. For example, the stage assemblies could be used for a conventional atmospheric air bearing stage. It could also be used either in air or vacuum with other types of bearings, where the gap and pressure are selected so as not to interfere with the stage performance.

Figure 9A:
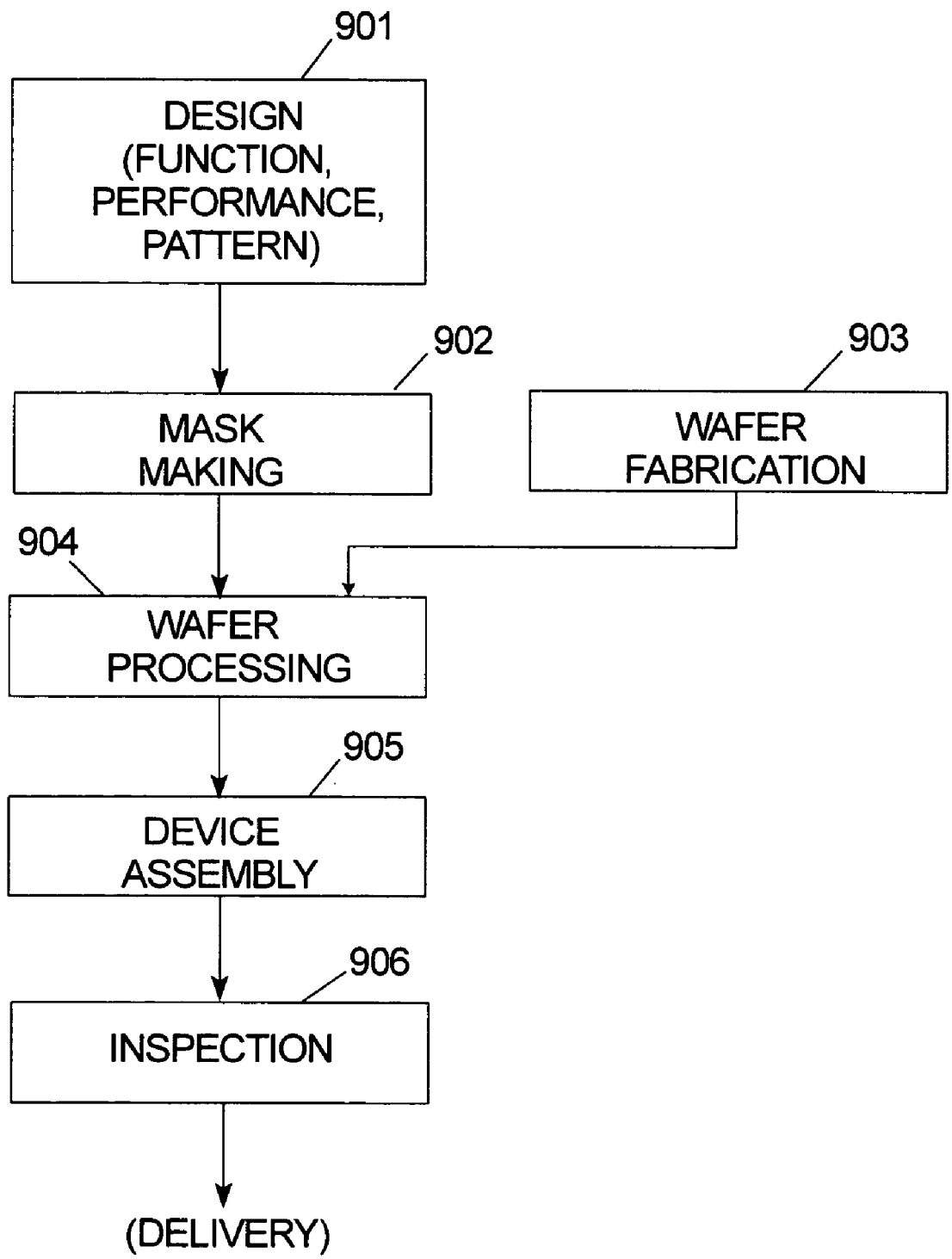
FIG. 9A is a flow chart that outlines a process for manufacturing a device in accordance with the present invention.

Semiconductor devices can be fabricated using the above described systems, by the process shown generally in FIG. 9A. In step 901 the device's function and performance characteristics are designed. Next, in step 902, a mask (reticle) having a pattern is designed according to the previous designing step, and in a parallel step 903 a wafer is made from a silicon material. The mask pattern designed in step 902 is exposed onto the wafer from step 903 in step 904 by a photolithography system described hereinabove in accordance with the present invention. In step 905 the semiconductor device is assembled (including the dicing process, bonding process and packaging process), finally, the device is then inspected in step 706.

Figure 9B:
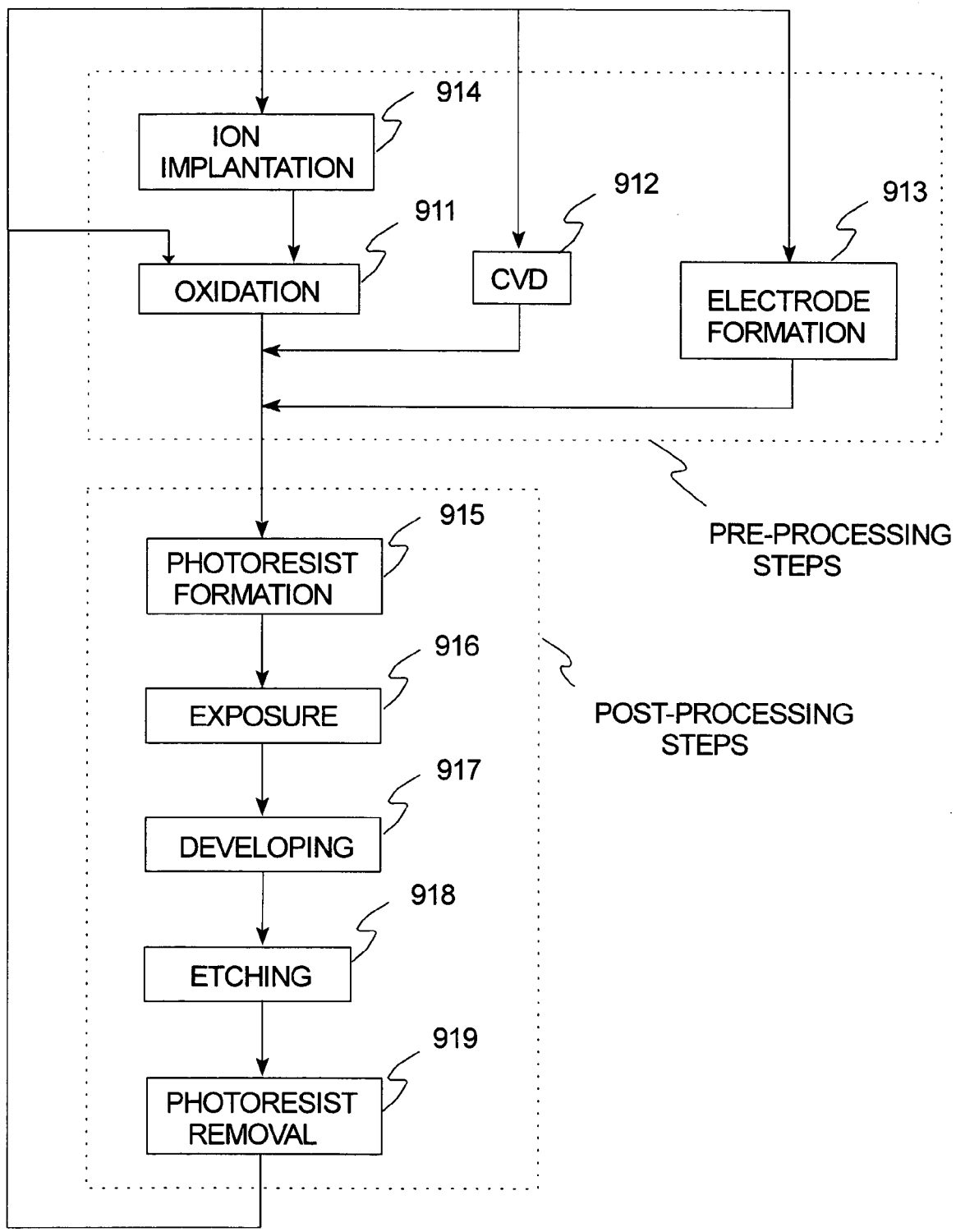
FIG. 9B is a flow chart that outlines device processing in more detail.

FIG. 9B illustrates a detailed flowchart example of the above-mentioned step 904 in the case of fabricating semiconductor devices. In FIG. 9B, in step 911 (oxidation step), the wafer surface is oxidized. In step 912 (CVD step), an insulation film is formed on the wafer surface. In step 913 (electrode formation step), electrodes are formed on the wafer by vapor deposition. In step 914 (ion implantation step), ions are implanted in the wafer. The above mentioned steps 911-914 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 915 (photoresist formation step), photoresist is applied to a wafer. Next, in step 916 (exposure step), the above-mentioned exposure device is used to transfer the circuit pattern of a mask (reticle) to a wafer. Then in step 917 (developing step), the exposed wafer is developed, and in step 918 (etching step), parts other than residual photoresist (exposed material surface) are removed by etching. In step 919 (photoresist removal step), unnecessary photoresist remaining after etching is removed.

Multiple circuit patterns are formed by repetition of these preprocessing and post-processing steps.

While the particular exposure apparatus 10 as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly for positioning a work piece, the stage assembly comprising:
   a stage that retains the work piece;
   a heat transfer region positioned near the stage;
   a fluid type bearing that maintains the stage spaced apart from the heat transfer region;
   a stage mover assembly that moves the stage; and
   an environmental system that controls the temperature of at least a portion of the stage by directly controlling the temperature of the heat transfer region, wherein the environmental system directs a circulation fluid to a circulation passageway positioned adjacent to a perimeter of the heat transfer region, and wherein heat is transferred between the heat transfer region and the stage via the fluid type bearing.

2. The stage assembly of claim 1 wherein the stage moves relative to the heat transfer region.

3. The stage assembly of claim 1 further comprising a heat transferer positioned within the stage that transfers heat from one portion of the stage to another portion of the stage.

4. The stage assembly of claim 1 wherein the heat transfer region guides the movement of the stage.

5. The stage assembly of claim 1 further comprising a shield assembly that shields the heat transfer region from the surrounding environment.

6. The stage assembly of claim 5 wherein the shield assembly includes a shield and a shield mover assembly that moves the shield to follow the stage.

7. The stage assembly of claim 1 wherein the environmental system maintains the temperature of the heat transfer region so that a temperature differential between the heat transfer region and the stage is at least approximately 0.5 degrees K.

8. The stage assembly of claim 1 wherein the environmental system controls the temperature of a temperature sensitive portion of the stage.

9. The stage assembly of claim 1 further comprising a chamber assembly that encircles the stage, and a chamber environmental system that controls the environment in the chamber assembly.

10. The stage assembly of claim 9 wherein the flow rate and temperature of the circulation fluid are controlled to maintain the stage at a predetermined temperature.

11. An exposure apparatus for transferring an image to a work piece, the exposure apparatus comprising: the stage assembly of claim 1 moving the work piece, and an illumination system that directs an energy beam at the work piece.

12. The stage assembly of claim 1 further comprising a heat transfer beam that defines the heat transfer region.

13. The stage assembly of claim 12 further comprising a transfer region aperture that extends transversely through the stage to receive the heat transfer beam.

14. The stage assembly of claim 13 wherein the fluid type bearing maintains the stage spaced apart from the heat transfer beam.

15. The stage assembly of claim 1 further comprising a heat transfer plate that is positioned adjacent to one side of the stage, wherein the heat transfer plate defines the heat transfer region.

16. The stage assembly of claim 15 wherein the fluid type bearing maintains the stage spaced apart from the heat transfer plate.

17. A stage assembly for positioning a work piece, the stage assembly comprising:
   a stage that retains the work piece;
   a guide beam that guides the movement of the stage along a first axis and inhibits movement of the stage along a second axis and along a third axis that are orthogonal to the first axis;
   a bearing that maintains the stage spaced apart from the guide beam, wherein the bearing is a fluid type bearing;
   a stage mover assembly that moves the stage relative to the guide beam;
   and
   an environmental system that controls the temperature of a portion of the stage by directly controlling the temperature of the guide beam, wherein heat is transferred between the guide beam and the stage via the bearing.

18. The stage assembly of claim 17 further comprising a shield assembly that shields the guide beam from the surrounding environment.

19. The stage assembly of claim 18 wherein the shield assembly includes a shield and a shield mover assembly that moves the shield to follow the stage.

20. The stage assembly of claim 17 wherein the environmental system directs a circulation fluid through the guide beam.

21. The stage assembly of claim 17 wherein the environmental system maintains the temperature of the guide beam so that a temperature differential between the guide beam and the stage is at least approximately 0.5 degrees K.

22. An exposure apparatus for transferring an image to a work piece, the exposure apparatus comprising: the stage assembly of claim 17 moving the work piece, and an illumination system that directs an energy beam at the work piece.

23. A method for positioning a work piece, the method comprising the steps of:
    retaining the work piece with a stage;
    moving the stage with a stage mover assembly;
    positioning a heat transfer region near the stage;
    maintaining the heat transfer region spaced apart from the stage with a fluid type bearing; and
    controlling the temperature of at least a portion of the stage by directly controlling the temperature of the heat transfer region with an environmental system that directs a circulation fluid to a circulation passageway positioned adjacent to a perimeter of the heat transfer region, wherein heat is transferred between the heat transfer region and the stage via the fluid type bearing.

24. The method of claim 23 further comprising the step of shielding the heat transfer region from the surrounding environment with a shield assembly.

25. A method for transferring an image to a work piece, the method comprising the steps of positioning the work piece by the method of claim 23 and directing an energy beam at the work piece with an illumination system.

26. A stage assembly for positioning a work piece, the stage assembly comprising:
    a stage that retains the work piece;
    a heat transfer region positioned near the stage;
    a fluid type bearing that maintains the stage spaced apart from the heat transfer region;
    a stage mover assembly that moves the stage;
    a guide beam that guides the movement of the stage along a first axis and inhibits movement of the stage along a second axis and a long a third axis that are orthogonal to the first; and
    an environmental system that controls the temperature of at least a portion of the stage by directly controlling the temperature of the heat transfer region, wherein heat is transferred between the heat transfer region and the stage via the fluid type bearing.

27. The stage assembly of claim 26 wherein heat transfer region is part of the guide beam.

28. The stage assembly of claim 27 wherein the heat transfer region is defined by the outer perimeter of the guide beam.

29. The stage assembly of claim 26 wherein the stage includes a stage aperture that extends transversely through the stage to receive the guide beam, and a plurality of slider regions positioned in the stage aperture, wherein each slider region includes a first bearing pad, a spaced apart second bearing pad, and a relieved area that separates the bearing pads.

30. The stage assembly of claim 29 wherein a stage gap is maintained between each bearing pad and the heat transfer region and wherein the fluid type bearing is created between each bearing pad and the guide beam.

31. The stage assembly of claim 30 wherein a relief gap is maintained between the relieved area and the heat transfer region and wherein the relief gap is greater than the stage gap.

32. The assembly of claim 30 wherein the environmental system directs a circulation fluid near the heat transfer region, and wherein the flow rate and the temperature of the circulation fluid are controlled to maintain a predetermined temperature difference between the heat transfer region and the slider regions.

33. The stage assembly of claim 26 wherein the stage mover assembly includes a first component that is secured to the guide beam and a second component that is secured to the stage.

34. A stage assembly for positioning a work piece, the stage assembly comprising:
    a stage that retains the work piece;
    a heat transfer region positioned near the stage;
    a fluid type bearing that maintains the stage spaced apart from the heat transfer region;
    a stage mover assembly that moves the stage;
    a heat transferer positioned within the stage that transfers heat from one portion of the stage to another portion of the stage; and
    an environmental system that controls the temperature of at least a portion of the stage by directly controlling the temperature of the heat transfer region, wherein heat is transferred between the heat transfer region and the stage via the fluid type bearing.

* * * * *